United States Patent
Kim et al.

(10) Patent No.: US 11,362,218 B2
(45) Date of Patent: Jun. 14, 2022

(54) METHOD OF FORMING SPLIT GATE MEMORY CELLS WITH THINNED SIDE EDGE TUNNEL OXIDE

(71) Applicant: Silicon Storage Technology, Inc., San Jose, CA (US)

(72) Inventors: Jinho Kim, Saratoga, CA (US); Elizabeth Cuevas, Los Gatos, CA (US); Yuri Tkachev, Sunnyvale, CA (US); Parviz Ghazavi, San Jose, CA (US); Bernard Bertello, Bouches du Rhones (FR); Gilles Festes, Fuveau (FR); Bruno Villard, Aix en Provence (FR); Catherine Decobert, Pourrieres (FR); Nhan Do, Saratoga, CA (US); Jean Francois Thiery, Vaucluse (FR)

(73) Assignee: Silicon Storage Technology, Inc., San Jose, CA (US)

( * ) Notice: Subject to any disclaimer, the term of this patent is extended or adjusted under 35 U.S.C. 154(b) by 109 days.

(21) Appl. No.: 16/910,022

(22) Filed: Jun. 23, 2020

(65) Prior Publication Data
US 2021/0399127 A1    Dec. 23, 2021

(51) Int. Cl.
*H01L 27/11517* (2017.01)
*H01L 27/11531* (2017.01)
(Continued)

(52) U.S. Cl.
CPC ...... *H01L 29/788* (2013.01); *H01L 27/11517* (2013.01); *H01L 27/11531* (2013.01);
(Continued)

(58) Field of Classification Search
CPC .......... H01L 29/42328; H01L 29/0847; H01L 29/66825; H01L 29/7881; H01L 29/7883;
(Continued)

(56) References Cited

U.S. PATENT DOCUMENTS

| 5,029,130 A | 7/1991 | Yeh |
| 5,512,505 A * | 4/1996 | Yuan ..................... H01L 27/115 |
| | | 257/E27.103 |

(Continued)

OTHER PUBLICATIONS

U.S. Appl. No. 16/781,798, entitled "Method Of Forming Split Gate Memory Cells With Thinned Tunnel Oxide," filed Feb. 4, 2020, Kim, et al.
(Continued)

*Primary Examiner* — Maliheh Malek
(74) *Attorney, Agent, or Firm* — DLA Piper LLP (US)

(57) ABSTRACT

A memory device includes a semiconductor substrate with memory cell and logic regions. A floating gate is disposed over the memory cell region and has an upper surface terminating in opposing front and back edges and opposing first and second side edges. An oxide layer has a first portion extending along the logic region and a first thickness, a second portion extending along the memory cell region and has the first thickness, and a third portion extending along the front edge with the first thickness and extending along a tunnel region portion of the first side edge with a second thickness less than the first thickness. A control gate has a first portion disposed on the oxide layer second portion and a second portion vertically over the front edge and the tunnel region portion of the first side edge. A logic gate is disposed on the oxide layer first portion.

26 Claims, 22 Drawing Sheets

(51) Int. Cl.
| | |
|---|---|
| *H01L 29/788* | (2006.01) |
| *H01L 29/66* | (2006.01) |
| *H01L 27/11543* | (2017.01) |
| *H01L 27/11551* | (2017.01) |
| *H01L 27/11524* | (2017.01) |
| *H01L 27/11521* | (2017.01) |
| *H01L 27/11529* | (2017.01) |
| *H01L 27/11534* | (2017.01) |

(52) U.S. Cl.
CPC .. *H01L 27/11543* (2013.01); *H01L 29/66825* (2013.01); *H01L 27/11521* (2013.01); *H01L 27/11524* (2013.01); *H01L 27/11529* (2013.01); *H01L 27/11534* (2013.01); *H01L 27/11551* (2013.01)

(58) Field of Classification Search
CPC ............. H01L 29/7885; H01L 29/1083; H01L 29/1087; H01L 29/40111; H01L 29/40117; H01L 29/402; H01L 29/41783; H01L 29/42324; H01L 29/42344; H01L 29/42368; H01L 29/4916; H01L 29/495; H01L 29/66484; H01L 29/665; H01L 29/6653; H01L 29/66545; H01L 29/66659; H01L 29/66681; H01L 29/66689; H01L 29/66833; H01L 29/7816; H01L 29/7835; H01L 29/792; H01L 27/11517; H01L 27/11521; H01L 27/11524; H01L 27/11526; H01L 27/11529; H01L 27/11531; H01L 27/11534; H01L 27/11536; H01L 27/11546; H01L 27/11543; H01L 27/11551; H01L 27/115; H01L 27/105; H01L 27/11539; H01L 27/11573; H01L 27/1203; H01L 27/11568; H01L 27/10894; H01L 27/1052

See application file for complete search history.

(56) References Cited

U.S. PATENT DOCUMENTS

| | | | | |
|---|---|---|---|---|
| 5,889,700 | A * | 3/1999 | Bergemont | H01L 27/115 365/185.26 |
| 6,828,183 | B1 * | 12/2004 | Sung | H01L 27/105 438/257 |
| 7,084,453 | B2 * | 8/2006 | Chern | H01L 21/823462 438/257 |
| 9,343,466 | B1 * | 5/2016 | Zhang | H01L 21/32133 |
| 9,570,592 | B2 * | 2/2017 | Do | H01L 29/66484 |
| 9,721,958 | B2 * | 8/2017 | Yang | H01L 27/11536 |
| 9,972,493 | B2 * | 5/2018 | Su | H01L 21/28 |
| 10,418,451 | B1 * | 9/2019 | Do | H01L 21/31111 |
| 11,018,147 | B1 * | 5/2021 | Kim | H01L 27/11534 |
| 11,081,553 | B2 * | 8/2021 | Xing | H01L 21/32133 |
| 11,127,752 | B2 * | 9/2021 | Hsu | H01L 29/402 |
| 2005/0085038 | A1 | 4/2005 | Tu | |
| 2006/0099798 | A1 | 5/2006 | Nakagawa | |
| 2007/0063251 | A1 * | 3/2007 | Tu | H01L 27/11529 257/E29.302 |
| 2008/0050875 | A1 * | 2/2008 | Moon | H01L 27/105 438/257 |
| 2009/0085090 | A1 * | 4/2009 | Nagai | H01L 29/40114 257/316 |
| 2009/0283813 | A1 | 11/2009 | Ishii | |
| 2011/0037114 | A1 * | 2/2011 | Tsujita | H01L 29/40114 257/E21.422 |
| 2011/0095348 | A1 | 4/2011 | Chakihara | |
| 2013/0171814 | A1 | 7/2013 | Torii | |
| 2017/0084622 | A1 * | 3/2017 | Hsu | H01L 27/11573 |
| 2017/0103989 | A1 * | 4/2017 | Su | H01L 21/28035 |
| 2019/0115454 | A1 * | 4/2019 | Chiba | H01L 21/31111 |
| 2019/0229122 | A1 * | 7/2019 | Cai | H01L 27/11521 |
| 2021/0005724 | A1 * | 1/2021 | Wang | H01L 29/40114 |
| 2021/0005725 | A1 * | 1/2021 | Xing | H01L 21/32133 |
| 2021/0043752 | A1 * | 2/2021 | Lin | H01L 21/76294 |
| 2022/0013531 | A1 * | 1/2022 | Yang | H01L 29/66825 |
| 2022/0093623 | A1 * | 3/2022 | Wang | H01L 29/7851 |

OTHER PUBLICATIONS

PCT Search Report and Written Opinion dated May 7, 2021 from the related PCT Patent Application No. US2020/066451.

* cited by examiner

METHOD OF FORMING SPLIT GATE MEMORY CELLS WITH THINNED SIDE EDGE TUNNEL OXIDE

FIELD OF THE INVENTION

The present invention relates to split-gate non-volatile memory cells, and more particularly to a method of forming such cells.

BACKGROUND OF THE INVENTION

Split-gate type memory cell arrays are known. For example, U.S. Pat. No. 5,029,130, which is incorporated herein by reference for all purposes, discloses a split gate memory cell and its formation, which includes forming source and drain regions in the substrate with a channel region there between. A floating gate is disposed over and controls the conductivity of one portion of the channel region, and a control gate is disposed over and controls the conductivity of the other portion of the channel region. The control gate extends up and over the floating gate. The insulation between the floating gate and the control gate is referred to as the tunnel dielectric material (e.g. silicon dioxide, also referred to as oxide), because electrons tunnel through this dielectric material during an erase operation.

It is also known to form high voltage logic devices on the same wafer (substrate) as the split-gate memory cell array. FIGS. 1A-1G show the steps in forming high voltage logic devices (e.g. 12 volt logic devices) on the same wafer as the split gate memory cells according to a conventional method. A silicon semiconductor substrate 10 having an upper surface 10a, a memory cell region 14 and a logic region 16. Semiconductor substrate 10 is masked, i.e. photo resist is deposited, selectively exposed using a mask, and patterned (i.e., portions selectively removed) using a photolithographic process, leaving portions of the underlying material covered by remaining photo resist while leaving other portions of the underlying material (here the silicon semiconductor substrate 10, particularly upper surface 10a) exposed. The exposed substrate portions are etched away leaving trenches that are then filled with dielectric material (e.g. oxide) to form isolation regions 12 in the logic region 16 of the wafer, as shown in FIG. 1A (after photoresist removal). Isolation regions 12 are similarly formed in memory cell region 14 of the wafer (not shown), defining alternating columns of active regions 13 and isolation regions 12.

A dielectric material (e.g. silicon dioxide, hereinafter referred to as oxide) 18 is formed on the substrate 10, a layer of polysilicon (hereinafter referred to as poly) 20 is formed on oxide layer 18, and a layer of silicon nitride (hereinafter referred to as nitride) 22 is formed on poly layer 20, as shown in FIG. 1B. The wafer is masked with photoresist, and the nitride layer 22 selectively etched through openings in the photoresist in the memory cell region 14, to expose portions of the underlying poly layer 20. The exposed portions of the poly layer 20 are oxidized using an oxidation process, forming oxide areas 24 on the poly layer 20, as shown in FIG. 1C (after photoresist removal).

A nitride etch is used to remove the remaining nitride layer 22. An anisotropic poly etch is used to remove exposed portions of the poly layer 20, leaving blocks 20a of poly layer 20 underneath the oxide areas 24 in the memory cell region 14 (poly blocks 20a will constitute the floating gates of the memory cells), as shown in FIG. 1D. An oxide etch is used to remove the exposed portions of oxide layer 18 (i.e., those portions not under the remaining portion of poly layer 20). An oxide layer 26 is then formed over the structure either by deposition (which also thickens oxide areas 24) and/or by oxidation (which has no effect on oxide areas 24), as shown in FIG. 1E. A poly layer is then formed on the structure (i.e., on oxide layer 26 and oxide areas 24). The poly layer is then patterned by forming and patterning photoresist on the poly layer leaving portions of the poly layer exposed. The exposed portions of the poly layer are selectively removed by a poly etch, leaving poly blocks 28a in the memory cell region and poly blocks 28b in the logic region, as shown in FIG. 1F (after photoresist removal). Insulation spacers 30 are formed on the sides of poly blocks 28a and 28b by insulation material deposition and anisotropic etch, and implantations are performed to form source regions 32 and drain regions 34 in the memory cell region 14, and source regions 36 and drain regions 38 in the logic region 16, of substrate 10. The final structure is shown in FIG. 1G.

The above technique produces non-volatile memory cells (each with a floating gate 20a formed from the remaining portion of poly layer 20, a control gate in the form of poly block 28a, a source region 32 adjacent to (and also preferably extending partially under) an end of the floating gate 20a, and a drain region 34 adjacent an end of the control gate 28a) on the same substrate 10 as high voltage logic devices (each with a logic gate in the form of poly block 28b, source region 36 and drain region 38 adjacent first and second ends of the logic gate 28b). There are many advantages of this technique. First, the same poly layer is used to form both control gates 28a of the memory cells and the logic gates 28b of the logic devices, using a single poly deposition. Second, the same oxide layer 26 is used as the gate oxide for the logic devices (i.e., the oxide layer used to insulate the logic gates 28b from the substrate 10), the word line oxide for the memory cells (i.e., the oxide layer used to insulate the control gates 28a from the substrate 10), and the tunnel oxide for the memory cells (i.e., the oxide insulating the floating gate 20a from the control gate 28a through which electrons tunnel in the erase operation). Common manufacturing steps for forming elements in both the memory cell region 14 and the logic region 16 simplifies, expedites and lower the costs of manufacturing. Forming oxide areas 24, as described in relation to FIG. 1E, by oxidation results in the floating gates 20a having a concave upper surface that terminates in a sharp edge 120 facing the control gate 28a, which enhances tunneling performance and efficiency during erase (i.e., the erase operation includes placing a high voltage on the control gate 28a to cause electrons to tunnel from the sharp edge 120 of the floating gate 20a, through oxide layer 26, to the control gate 28a). The control gate 28a has a lower portion vertically over and insulated from the substrate 10 for controlling the conductivity of the channel region therein, and a second portion that extends up and over the floating gate 20a for voltage coupling and proximity to the floating gate sharp edge 120 for erasure.

One drawback of the above described technique is that the thickness of oxide layer 26 must be compatible for both the logic devices and the memory cells. Specifically, the oxide layer 26 must be thick enough for the high voltage operation of the logic gates 28b and control gates 28a, while being thin enough to allow tunneling from the floating gate 20a to the control gate 28a during the erase operation. Therefore, balancing these considerations, there is a lower limit to the thickness of oxide layer 26 driven by the high voltage operation of the control gates 28a and logic gates 28b, which means the portion of layer 26 through which tunneling occurs during erase operations of the memory cells (i.e. the portion of layer 26 between the control gate 28a and floating gate 20a) is unnecessarily thick and therefore limits erase performance and efficiency, and limits endurance performance. However, forming the tunnel oxide (between the control gate 28a and floating gate 20a) separately from the word line oxide (between the control gate 28a and the substrate 10) and the logic gate oxide (between the logic gate 28b and the substrate 10) can significantly increase manufacturing complexity, time and costs, as well as risk the integrity of the previously formed word line oxide and logic gate oxide thus lowering yield.

It would be desirable to increase memory cell erase efficiency between the floating gate and the control gate, without adversely affecting the performance of the control gate as a word line or of the logic gate in the logic device, where the same oxide layer is used in all three places.

BRIEF SUMMARY OF THE INVENTION

The aforementioned problems and needs are addressed by providing a memory device that includes a substrate of semiconductor material with a substrate upper surface having a memory cell region and a logic region, a floating gate disposed vertically over and insulated from the memory cell region of the substrate upper surface wherein the floating gate includes an upper surface that terminates in opposing front and back edges and in opposing first and second side edges, an oxide layer having a first portion that extends along the logic region of the substrate upper surface and has a first thickness a second portion that extends along the memory cell region of the substrate upper surface and has the first thickness and a third portion that extends along the front and back edges and along the first and second side edges, wherein the third portion of the oxide layer extending along the front edge has the first thickness and wherein the third portion of the oxide layer extending along a tunnel region portion of the first side edge has a second thickness less than the first thickness, a control gate having a first portion disposed on the second portion of the oxide layer and having a second portion disposed vertically over the front edge and vertically over the tunnel region portion of the first side edge, and a logic gate on the first portion of the oxide layer. The first portion of the oxide layer insulates the substrate from the logic gate, the second portion of the oxide layer insulates the substrate from the control gate first portion, and the third portion of the oxide layer along the tunnel region portion of the first side edge insulates the control gate second portion from the tunnel region portion of the first side edge.

A method of forming a memory device includes providing a substrate of semiconductor material with a substrate upper surface having a memory cell region and a logic region, forming a floating gate disposed vertically over and insulated from the memory cell region of the substrate upper surface wherein the floating gate includes an upper surface that terminates in opposing front and back edges and in opposing first and second side edges, forming an oxide layer having a first portion that extends along the logic region of the substrate upper surface and a second portion that extends along the memory cell region of the substrate upper surface and a third portion that extends along the front and back edges and along the first and second side edges, performing an oxide etch that reduces a thickness of the third portion of the oxide layer along a tunnel region portion of the first side edge wherein the first and second portions of the oxide layer and the third portion of the oxide layer along the front edge of the floating gate are protected from the oxide etch, forming a control gate having a first portion disposed on the second portion of the oxide layer and having a second portion disposed vertically over the front edge and vertically over the tunnel region portion of the first side edge, and forming a logic gate on the first portion of the oxide layer. The first portion of the oxide layer insulates the substrate from the logic gate and has a first thickness, the second portion of the oxide layer insulates the substrate from the control gate first portion and has the first thickness, and the third portion of the oxide layer along the tunnel region portion of the first side edge insulates the control gate second portion from the tunnel region portion of the first side edge and has a second thickness less than the first thickness.

A memory device includes a substrate of semiconductor material with a substrate upper surface having a memory cell region and a logic region, a floating gate disposed vertically over and insulated from the memory cell region of the substrate upper surface wherein the floating gate includes an upper surface that terminates in opposing front and back edges and in opposing first and second side edges, a first oxide layer having a first portion that extends along the logic region of the substrate upper surface and has a first thickness and a second portion that extends along the memory cell region of the substrate upper surface and has the first thickness and a third portion that extends along the front edge and has the first thickness, a second oxide layer extending along a tunnel region portion of the first side edge and has a second thickness less than the first thickness, a control gate having a first portion disposed on the second portion of the oxide layer and having a second portion disposed vertically over the front edge and vertically over the tunnel region portion of the first side edge, and a logic gate on the first portion of the oxide layer. The first portion of the first oxide layer insulates the substrate from the logic gate, the second portion of the first oxide layer insulates the substrate from the control gate first portion, and the second oxide layer along the tunnel region portion of the first side edge insulates the control gate second portion from the tunnel region portion of the first side edge.

A method of forming a memory device includes providing a substrate of semiconductor material with a substrate upper surface having a memory cell region and a logic region, forming a floating gate disposed vertically over and insulated from the memory cell region of the substrate upper surface wherein the floating gate includes an upper surface that terminates in opposing front and back edges and in opposing first and second side edges, forming a first oxide layer having a first portion that extends along the logic region of the substrate upper surface and a second portion that extends along the memory cell region of the substrate upper surface and a third portion that extends along the front and back edges and along the first and second side edges, performing an oxide etch that removes the third portion of the first oxide layer along a tunnel region portion of the first side edge wherein the first and second portions of the first oxide layer and the third portion of the first oxide layer along the front edge of the floating gate are protected from the oxide etch, forming a second oxide layer along the tunnel region portion of the first side edge, forming a control gate having a first portion disposed on the second portion of the first oxide layer and having a second portion disposed vertically over the front edge and vertically over the tunnel region portion of the first side edge, and forming a logic gate on the first portion of the first oxide layer. The first portion of the first oxide layer insulates the substrate from the logic gate and has a first thickness, the second portion of the first oxide layer insulates the substrate from the control gate first portion and has the first thickness, and the second oxide layer along the tunnel region portion of the first side edge insulates the control gate second portion from the tunnel region portion of the first side edge and has a second thickness less than the first thickness.

Other objects and features of the present invention will become apparent by a review of the specification, claims and appended figures.

DETAILED DESCRIPTION OF THE INVENTION

Figure 1A:
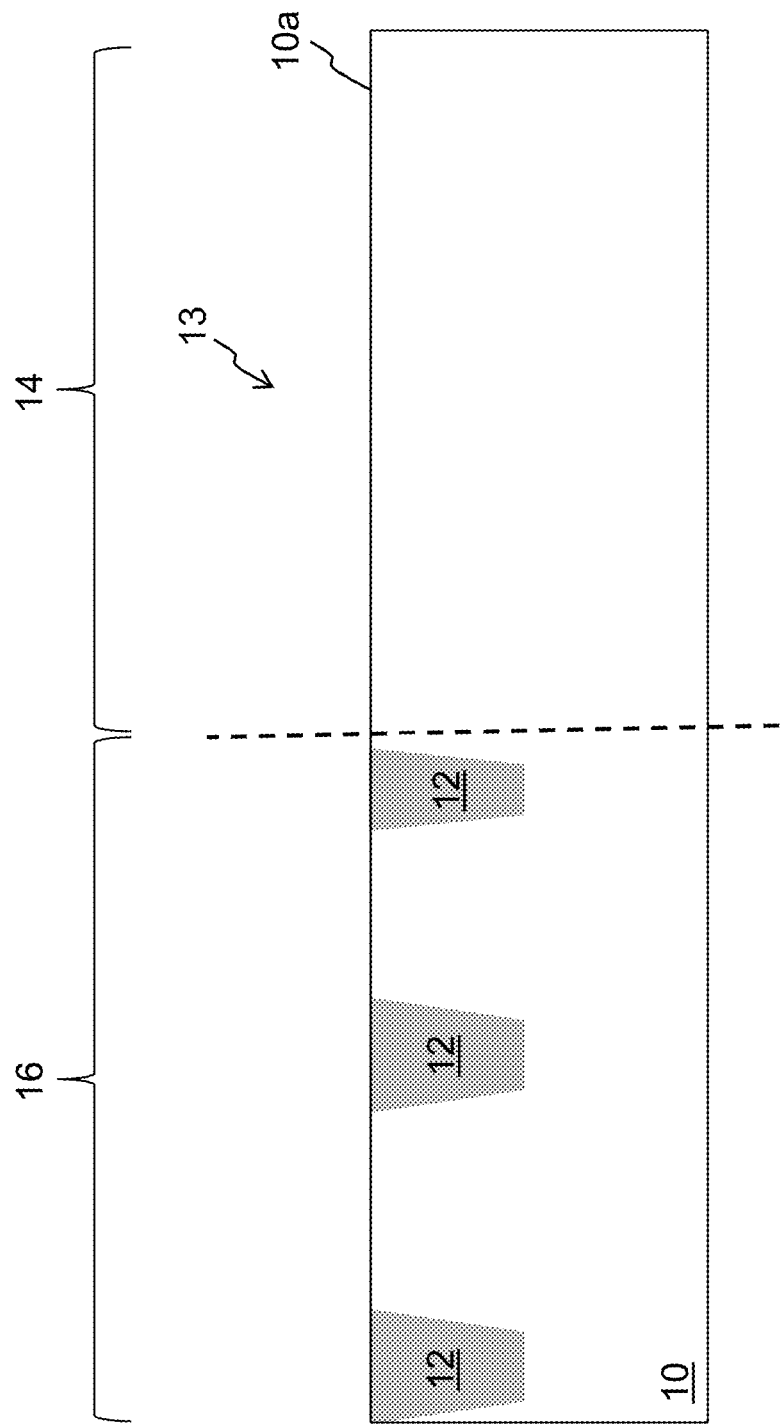
FIGS. 1A-1G are side cross-sectional views illustrating conventional steps for forming memory cells and logic devices on a common substrate.
Figure 1B:
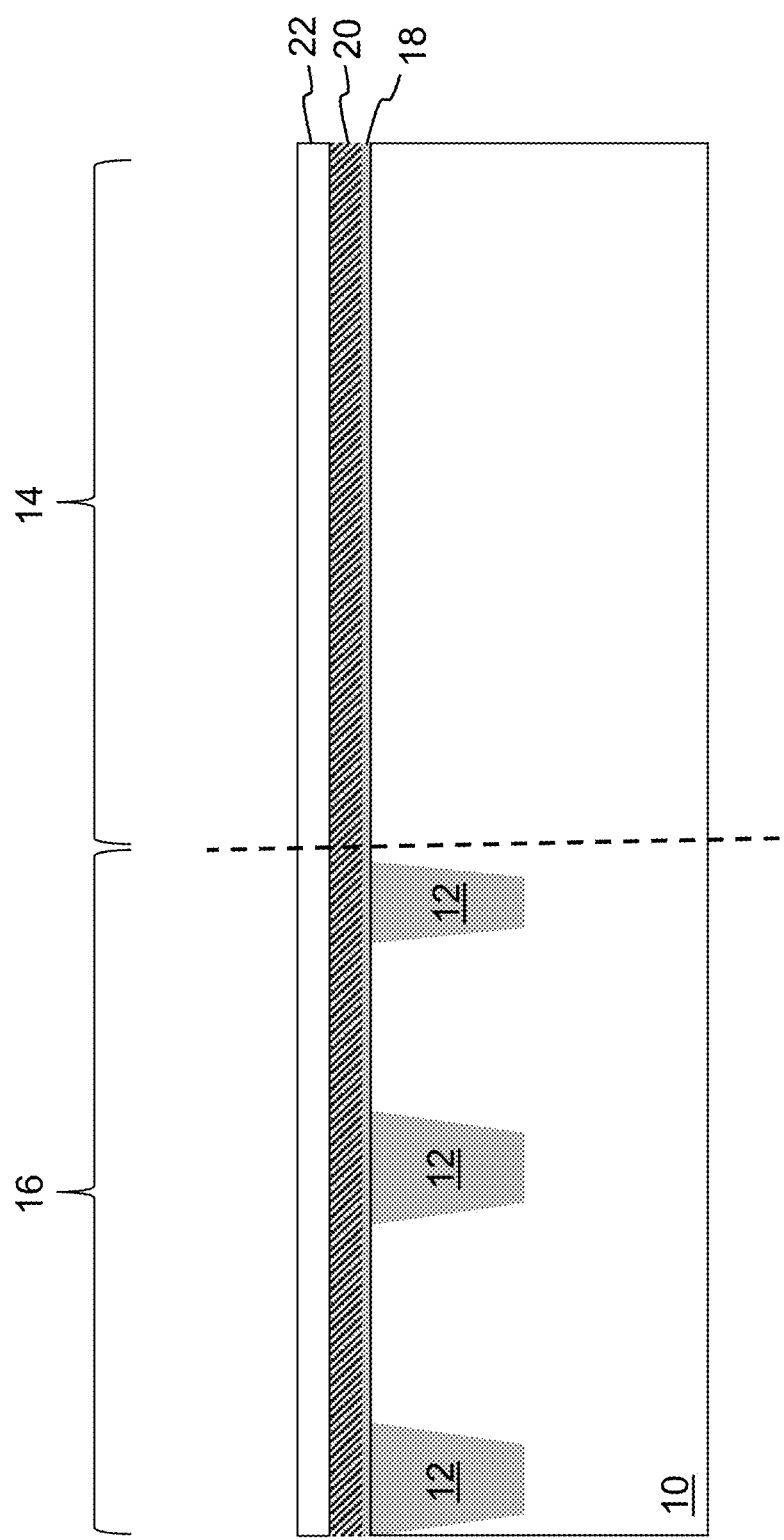
Figure 1C:
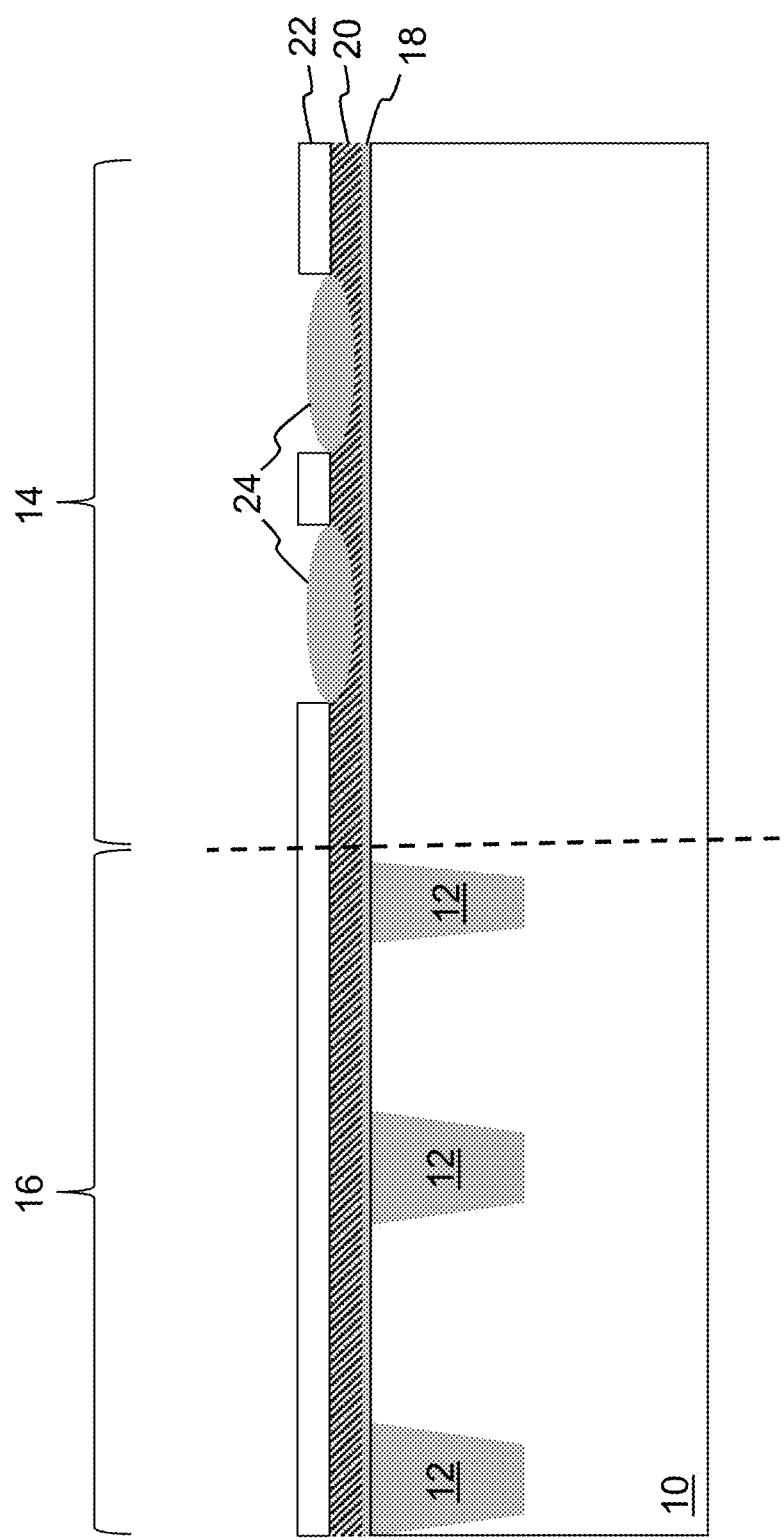
Figure 1D:
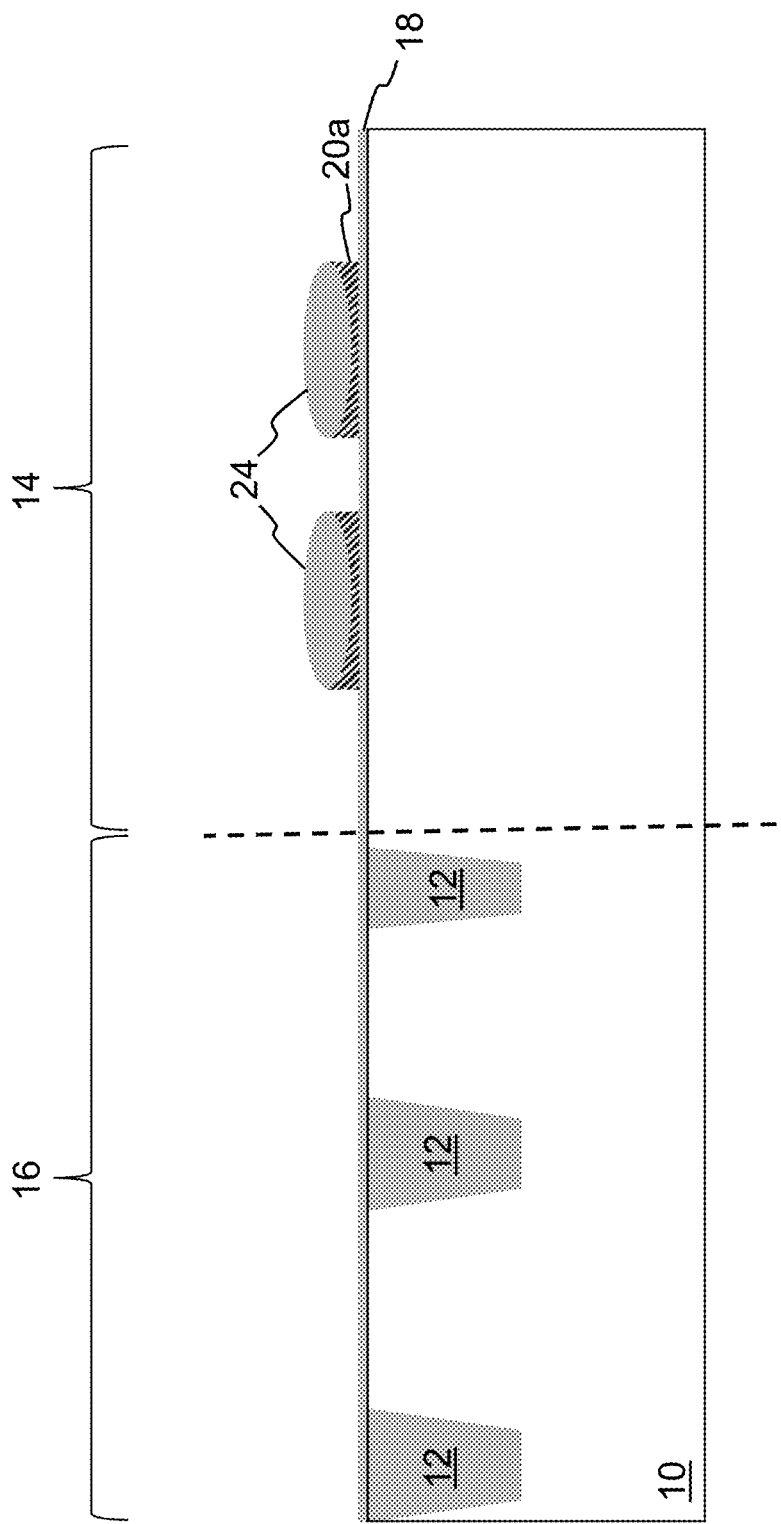
Figure 1E:
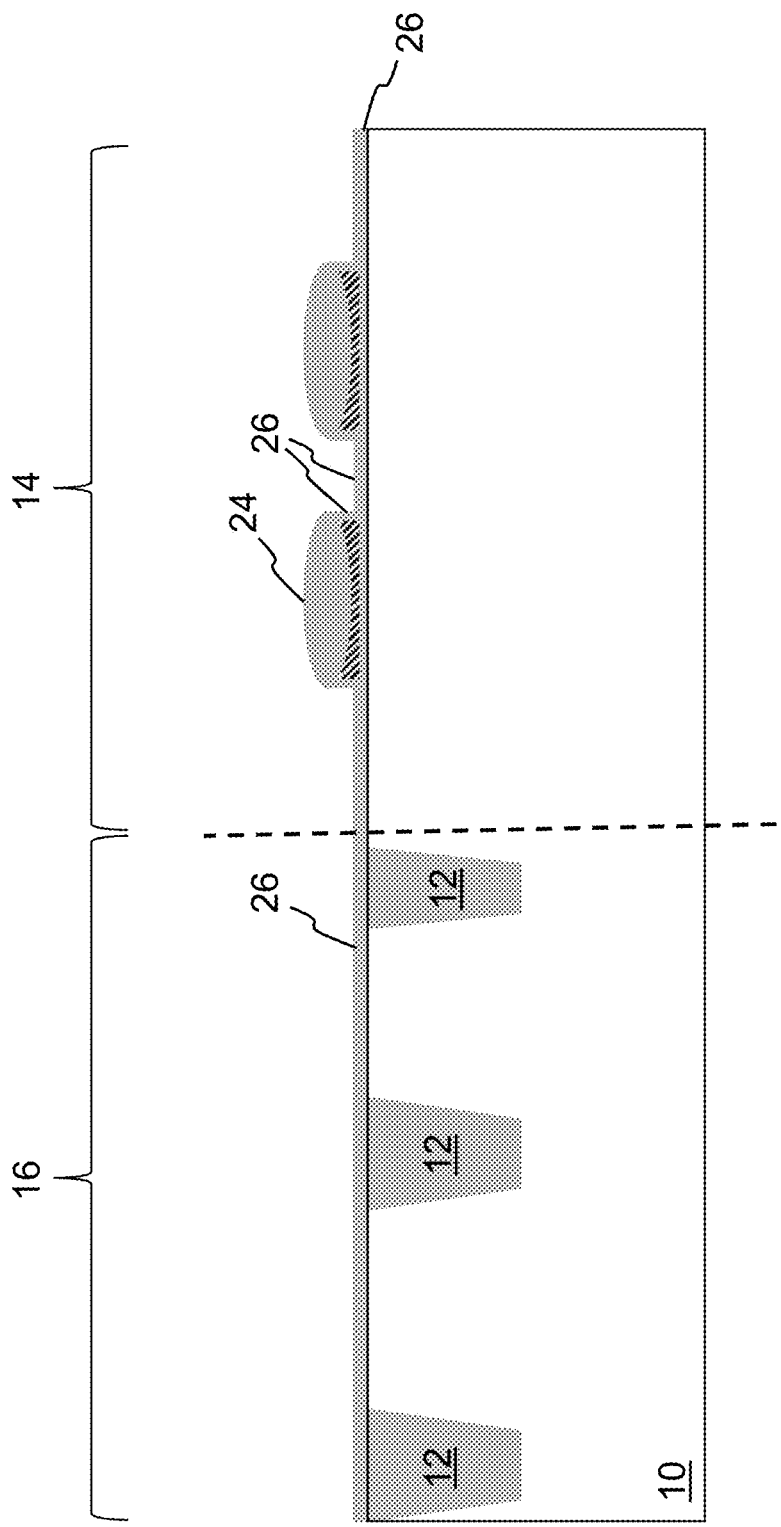

The present invention is a technique of forming memory cells and logic devices on a common substrate, where a portion of the oxide layer used as a tunnel oxide is selectively thinned.

FIGS. 2A-2E and 3A-3C disclose steps of an embodiment of the method of the present invention. The process begins using the same steps described above with respect to FIGS. 1A-1E, resulting in the structure shown in the cross sectional view of the memory cell region 14 and logic device region 16 in FIG. 2A, and shown in the top view of the memory cell region 14 in FIG. 3A. At this stage of processing, there are alternating columns of active regions 13 and isolation regions 12 in the memory cell region 14, with pairs of floating gates 20a formed in each active region column 13. Each floating gate 20a has a concave upper surface terminating in sharp edges 120, 122 and 124 at the perimeter of the upper surface of the floating gate 20a. Each floating gate 20a partially overlap the respective isolation region 12 to provide margin for any misalignment. Specifically, for each pair of floating gates 20a, sharp edges 120 are the two edges of the two floating gates 20a that face away from each other (also referred to as front edges 120), sharp edges 122 are the two edges of the two floating gates 20a that face toward each other (also referred to as back edges 122), and sharp edges 124 are the two edges of each floating gate 20a extending between sharp edges 120 and 122 and are disposed over the isolation regions 12 (also referred to as side edges 124). Thus, for each floating gate 20a, front and back edges 120 and 122 oppose each other, and the two side edges 124 oppose each other (also referred to as first and second side edges 124). Floating gates 20a are shown and described herein as rectangular, but they need not be rectangular in shape. Source line diffusion areas 40 each extend in the row direction and between the pairs of the floating gates 20a (for connecting together a row of the source regions formed later in the process). Oxide layer 26 can be considered to have three portions: a first portion 26a that extends along the logic region 16 of the substrate upper surface 10a, a second portion 26b that extends along the memory cell region 14 of the substrate upper surface 10a, and a third portion 26c that extends along the sides and sharp edges 120, 122, 124 of the floating gates 20a.

Figure 2A:
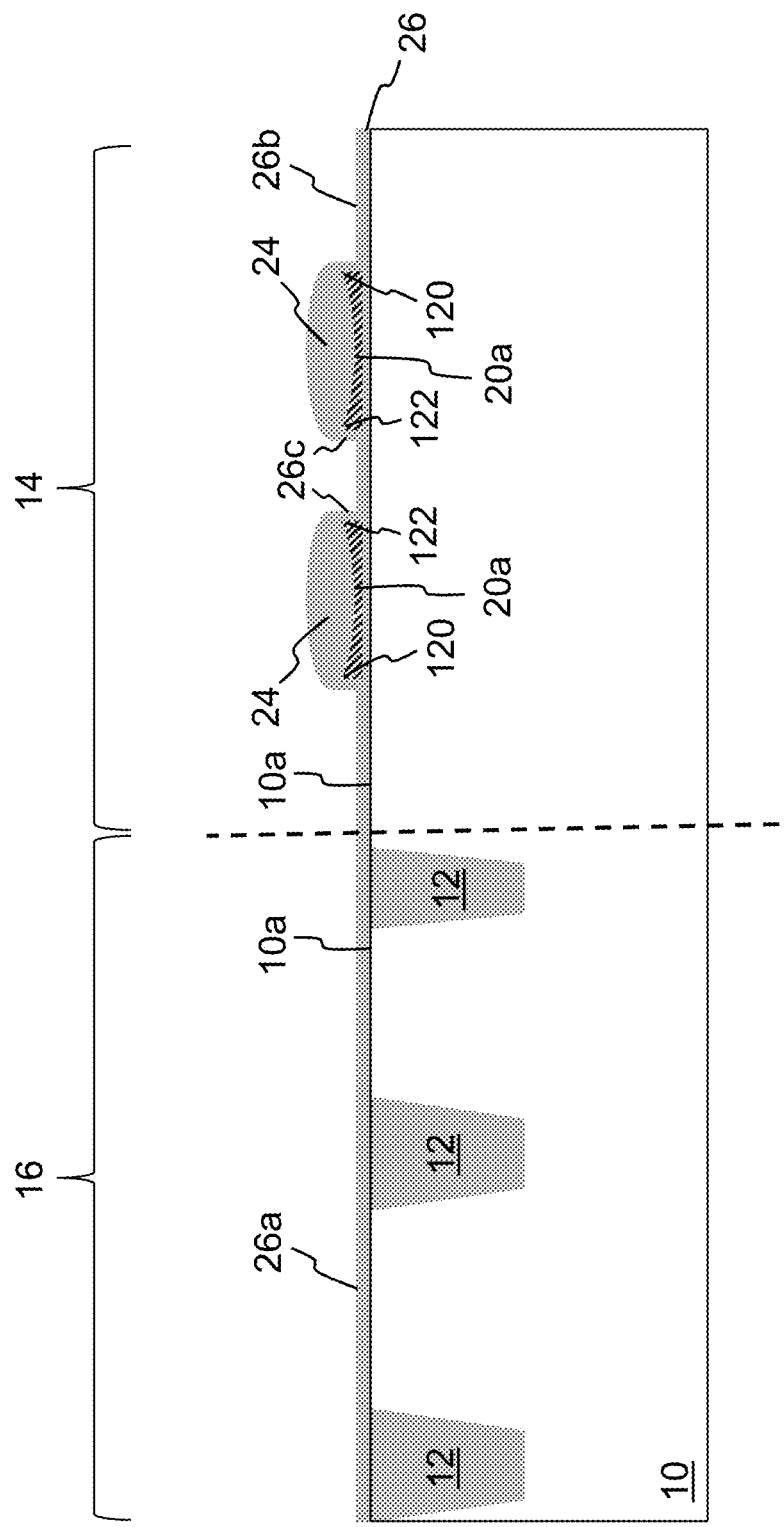
FIGS. 2A-2E are side cross-sectional views illustrating steps for forming memory cells and logic devices on a common substrate in accordance with the present invention.
Figure 2B:
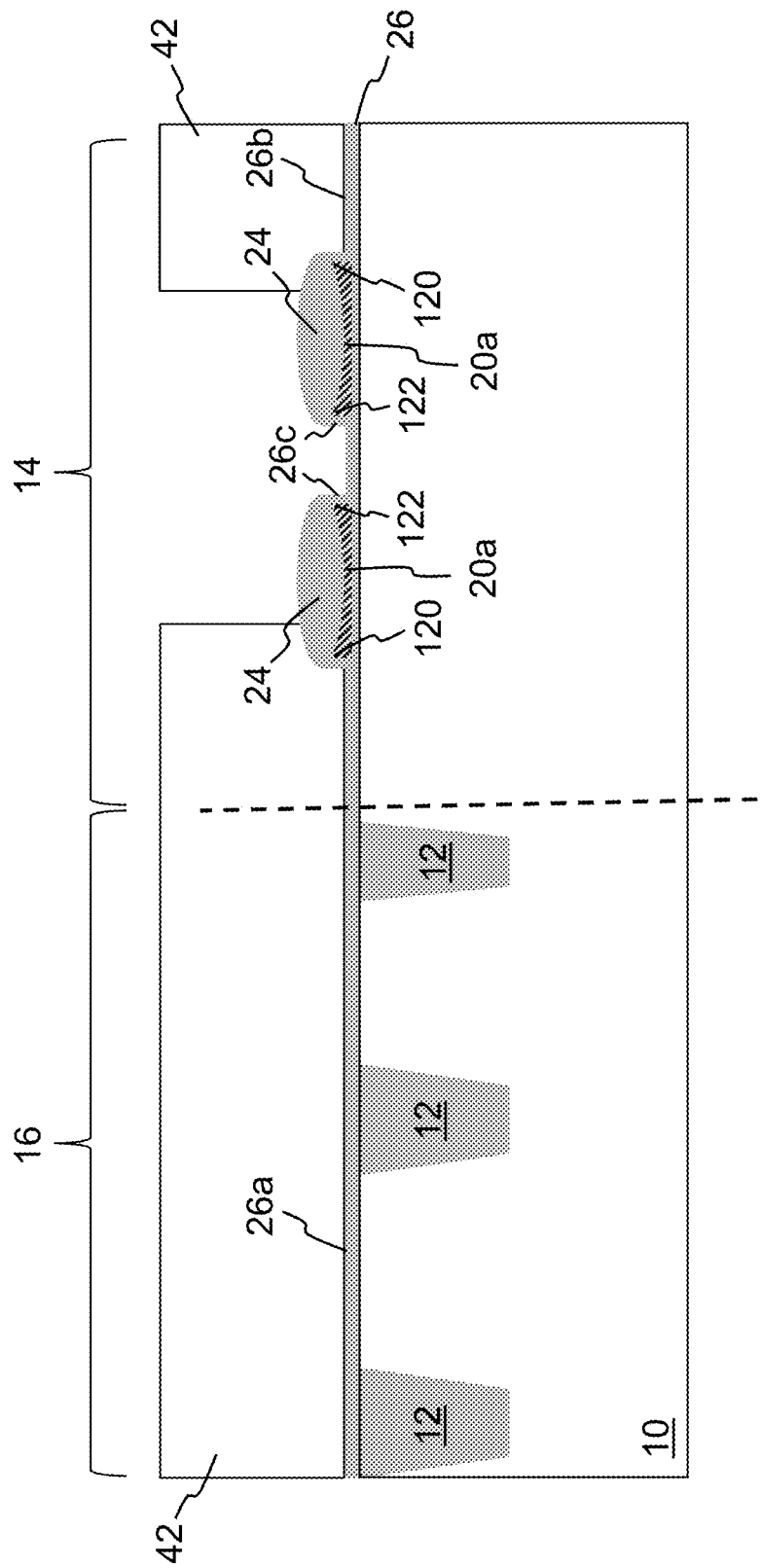
Figure 3A:
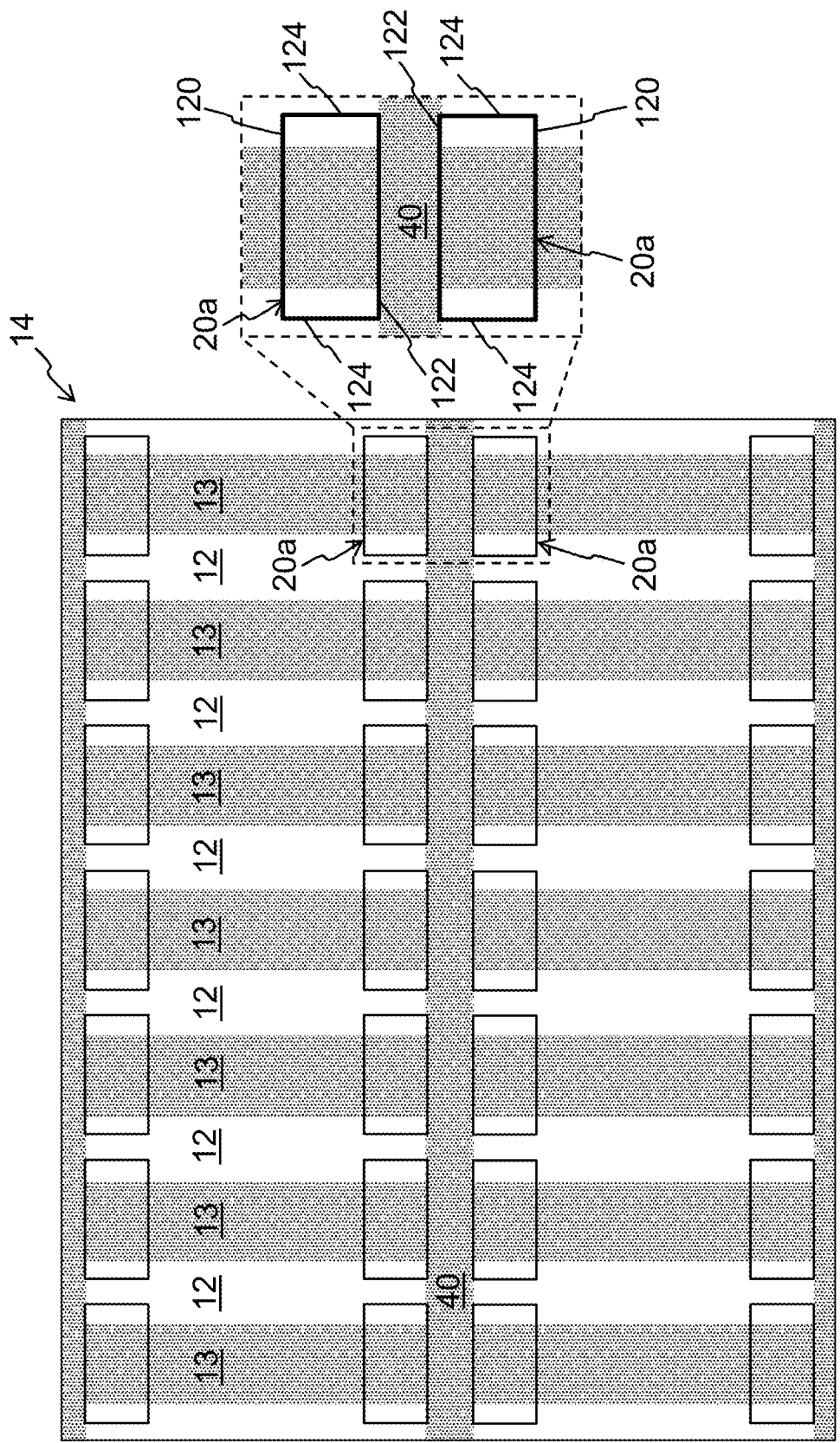
FIGS. 3A-3C are top views illustrating steps for forming memory cells and logic devices on a common substrate in accordance with the present invention.
Figure 3B:
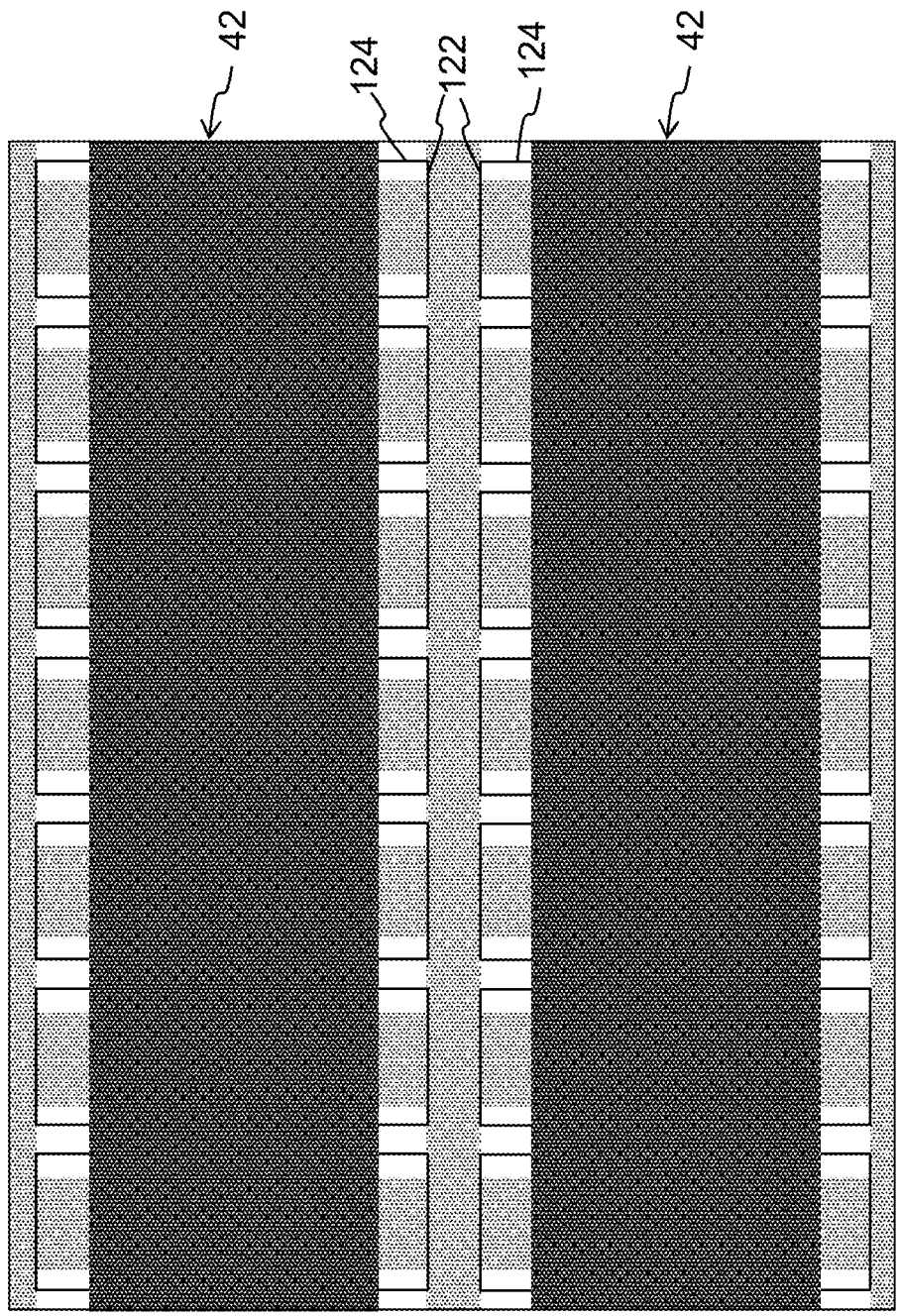

Photoresist 42 is formed over the structure and patterned to remove portions of the photoresist 42, such that the remaining photoresist 42 covers the logic device region 16, but only portions of the memory cell region 14. Specifically, photoresist 42 covers front edges 120 and only a portion of each side edge 124. However, left uncovered by photoresist 42 are back edges 122 and a portion of each side edge 124, including the portions of oxide layer 26c thereon, as shown in FIGS. 2B and 3B.

Figure 2C:
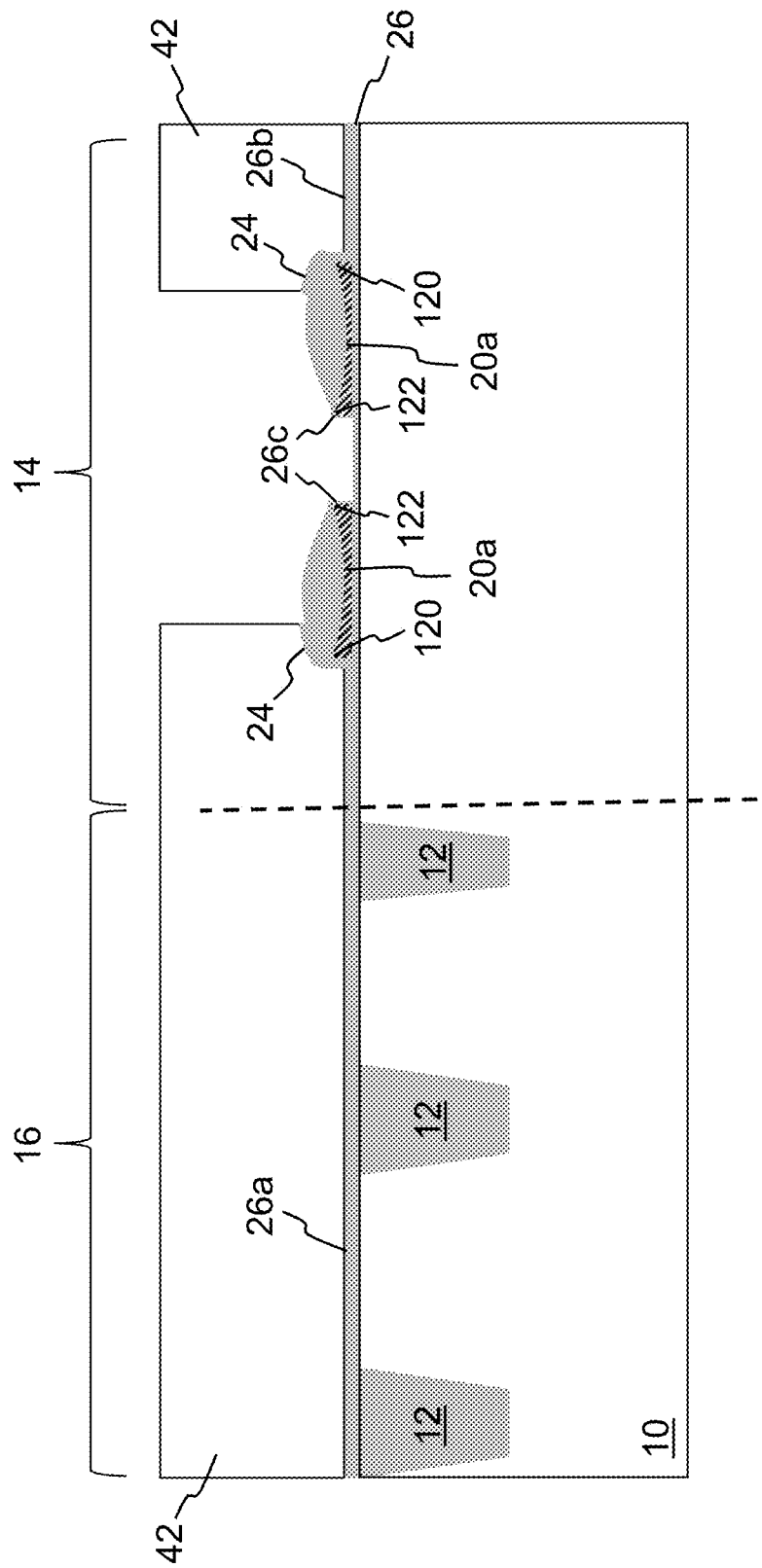

An oxide etch (e.g., wet or dry etch) is then performed on the exposed portions of oxide layer 26c and oxide 24, which reduces the thickness of layer portion 26c on portions of the side edges 124 and on back edges 122 (which are not subjected to high voltage operation), as shown in FIG. 2C. The photoresist 42 protects oxide layer portion 26a in the logic device region 16, as well as the oxide layer portions 26b on the substrate surface that are adjacent front edges 120 (on which the control gates will eventually be formed) and the other portions of oxide layer 26c.

Figure 1F:
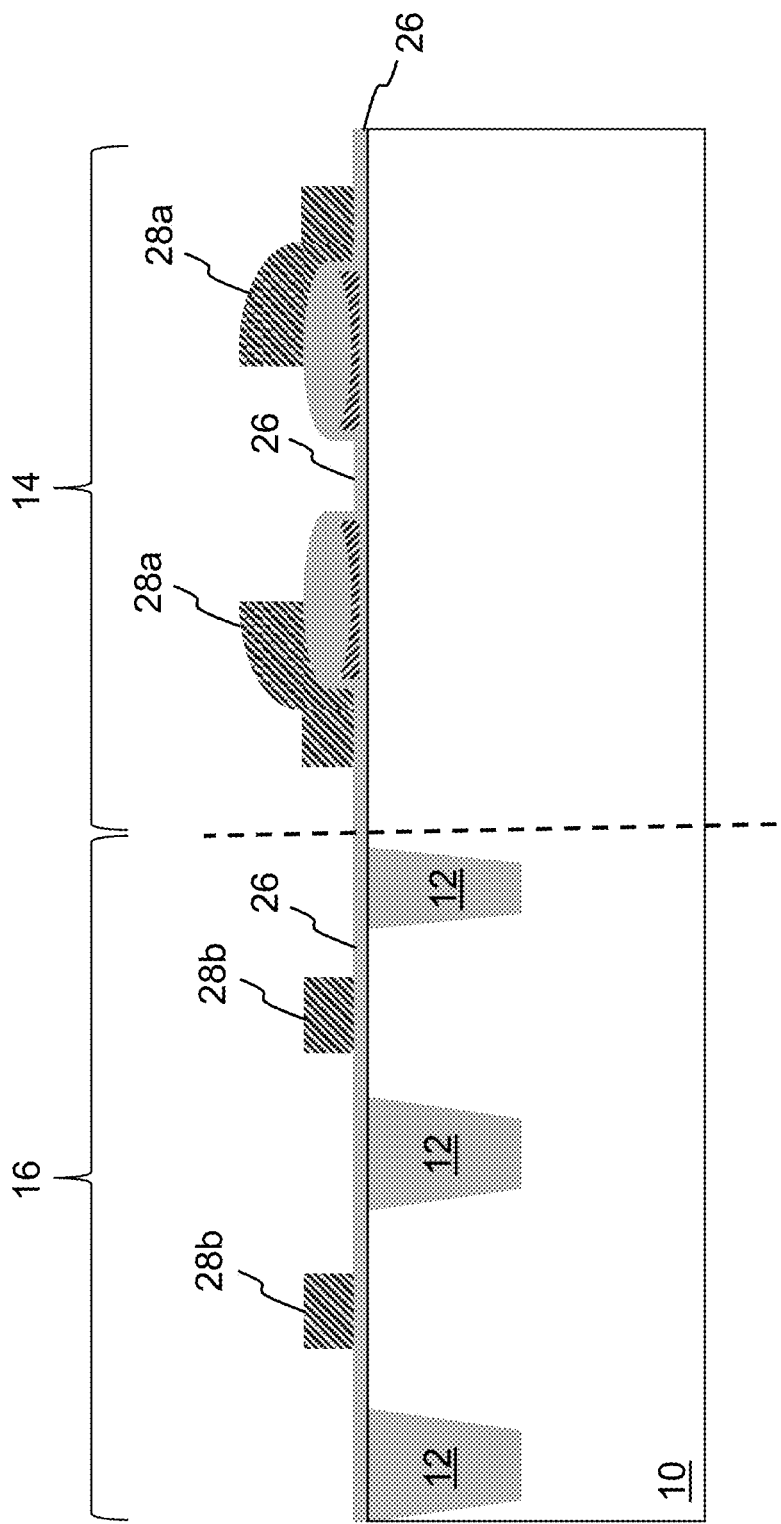
Figure 1G:
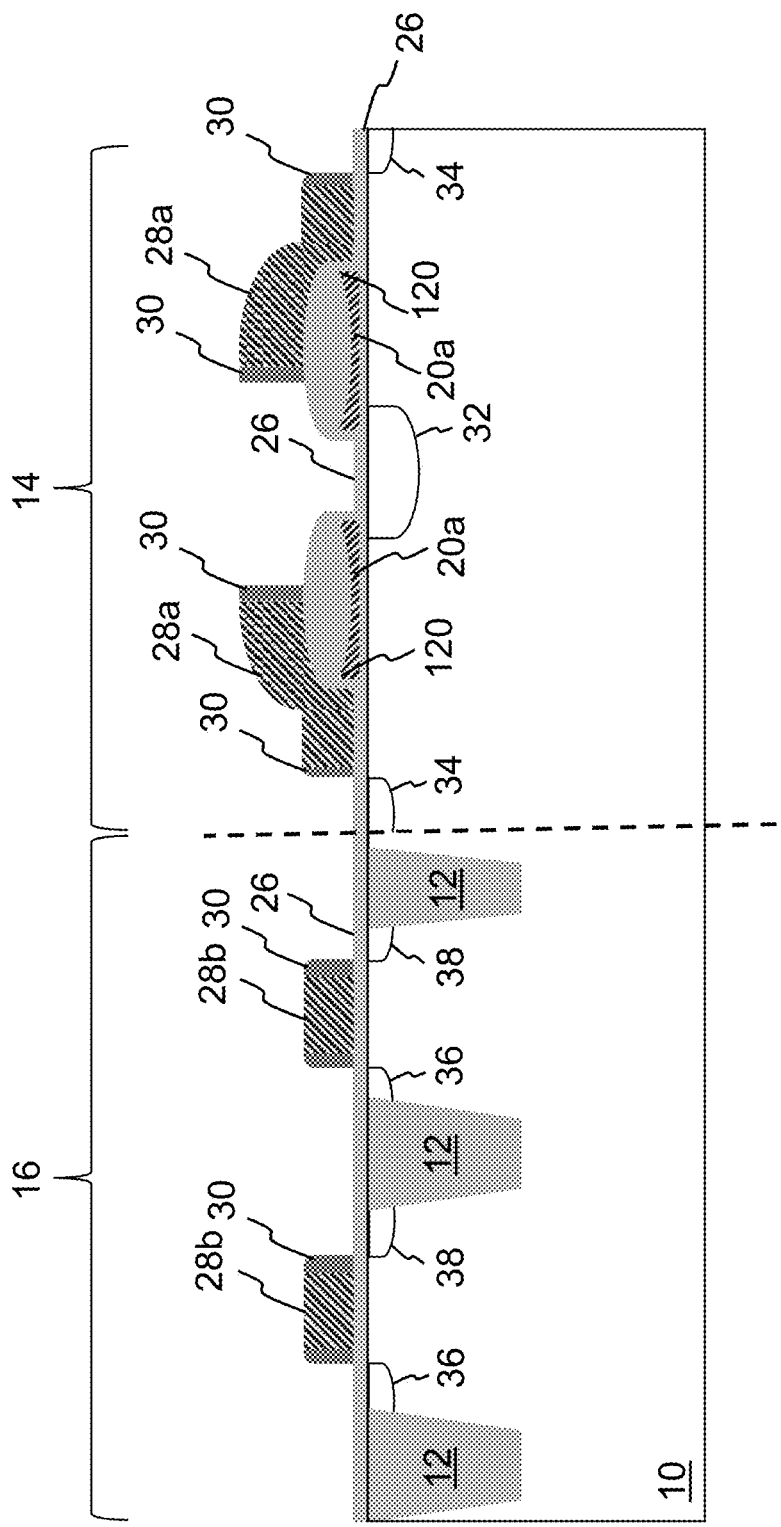
Figure 2D:
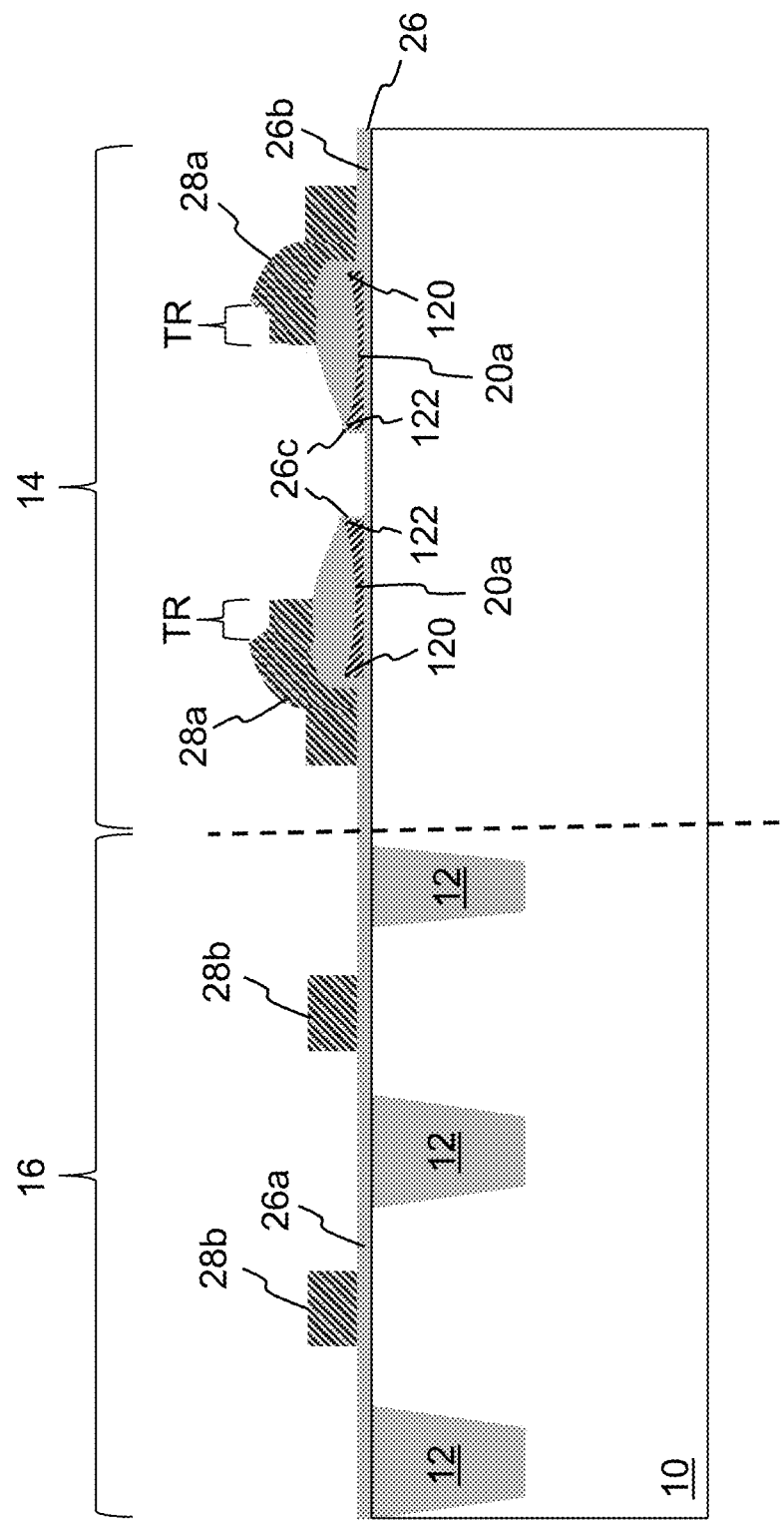
Figure 2E:
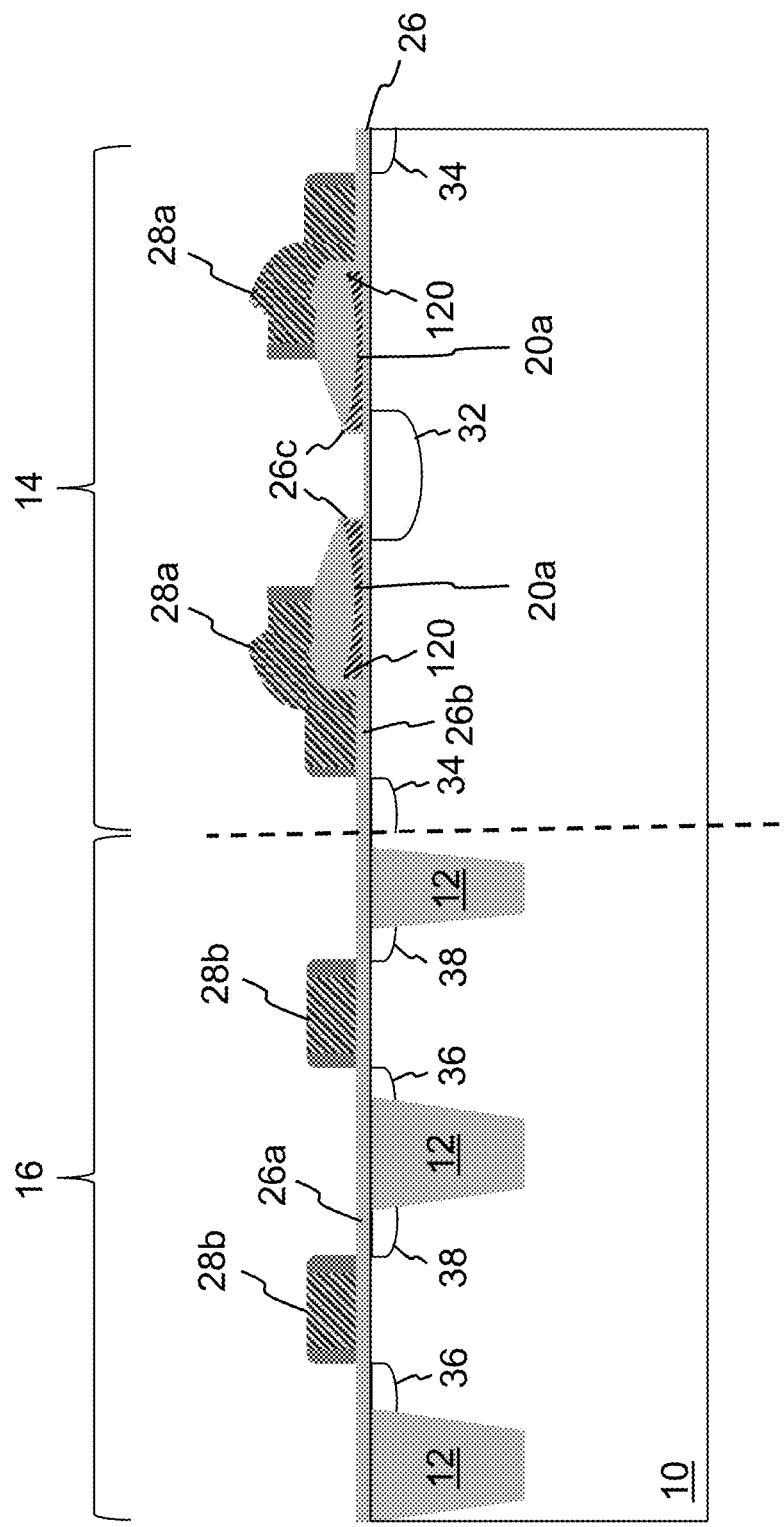
Figure 3C:
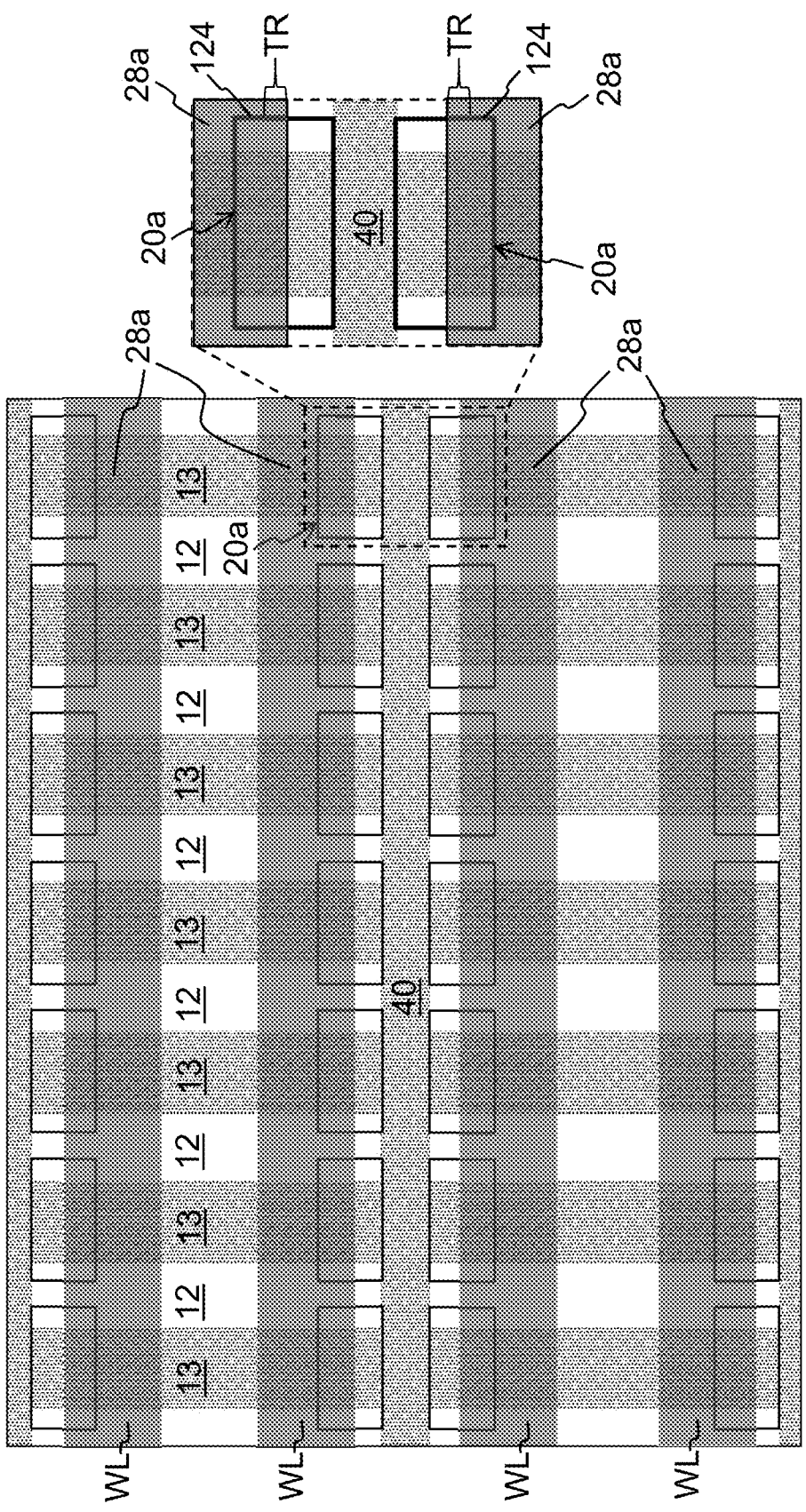
Figure 4:
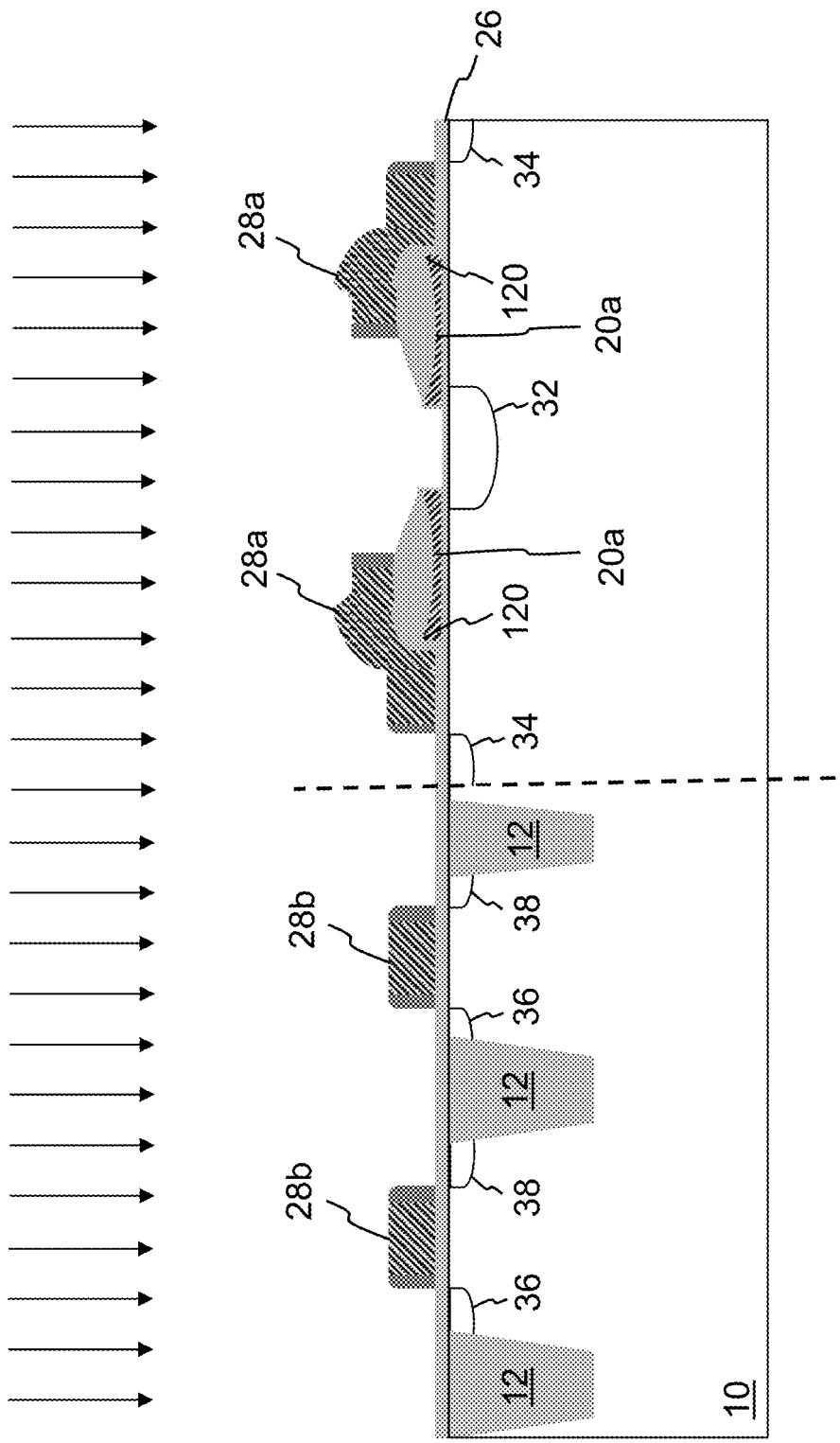
FIG. 4 is a side cross-sectional view illustrating an implantation.

After photoresist 42 is removed, a poly layer deposition and patterning as described above with respect to FIGS. 1E-1F is performed to form the control gates formed from poly blocks 28a and logic gates formed from poly blocks 28b, as shown in FIGS. 2D and 3C. Control gates 28a in each row are formed as a continuous word line WL. Each control gate 28a extends up and over a respective front edge 120, and over a portion of each respective side edge 124, including a tunnel region portion TR of each side edge 124 for which layer portion 26c was thinned by the oxide etch shown in FIG. 2C and is now vertically covered by control gate 28a. Specifically, the tunnel region portion TR is that portion of each side edge 124 which was subjected to oxide layer 26a thinning and which is later vertically covered by control gate 28a. The remaining steps described above with respect to FIG. 1F are performed to result in the final structure shown in FIG. 2E. Preferably a single implantation is used to simultaneously form the drain regions 34 in the memory cell region 14, and source regions 36 and drain regions 38 in the logic region 16, as shown in FIG. 4.

The resulting structure has logic gates 28b and control gates 28a insulated from the substrate 10 by portions of the oxide layer 26 (i.e., oxide portions 26a and 26b) having a first thickness, and the control gates 28a are insulated from the tunnel region portion TR of the side edges 124 by the thinned portions of oxide 26c having a second thickness that is less than the first thickness. This structure enhances the erase efficiency and performance of the memory cell by enhancing tunneling efficiency between the control gate 28a and the tunnel region portions TR of the side edges 124, without compromising the performance of the logic devices or adversely affecting the ability of the control gates 28a to control the conductivity of the channel region portion of the substrate underneath the control gates 28a. Specifically, the above described technique thins the oxide layer 26c on the tunnel region portions TR of the side edges 124 without risk of compromising the oxide layer portions 26a and 26b on which the logic gates 28b and control gate 28a are formed and which insulate them from the substrate 10.

Figure 5:
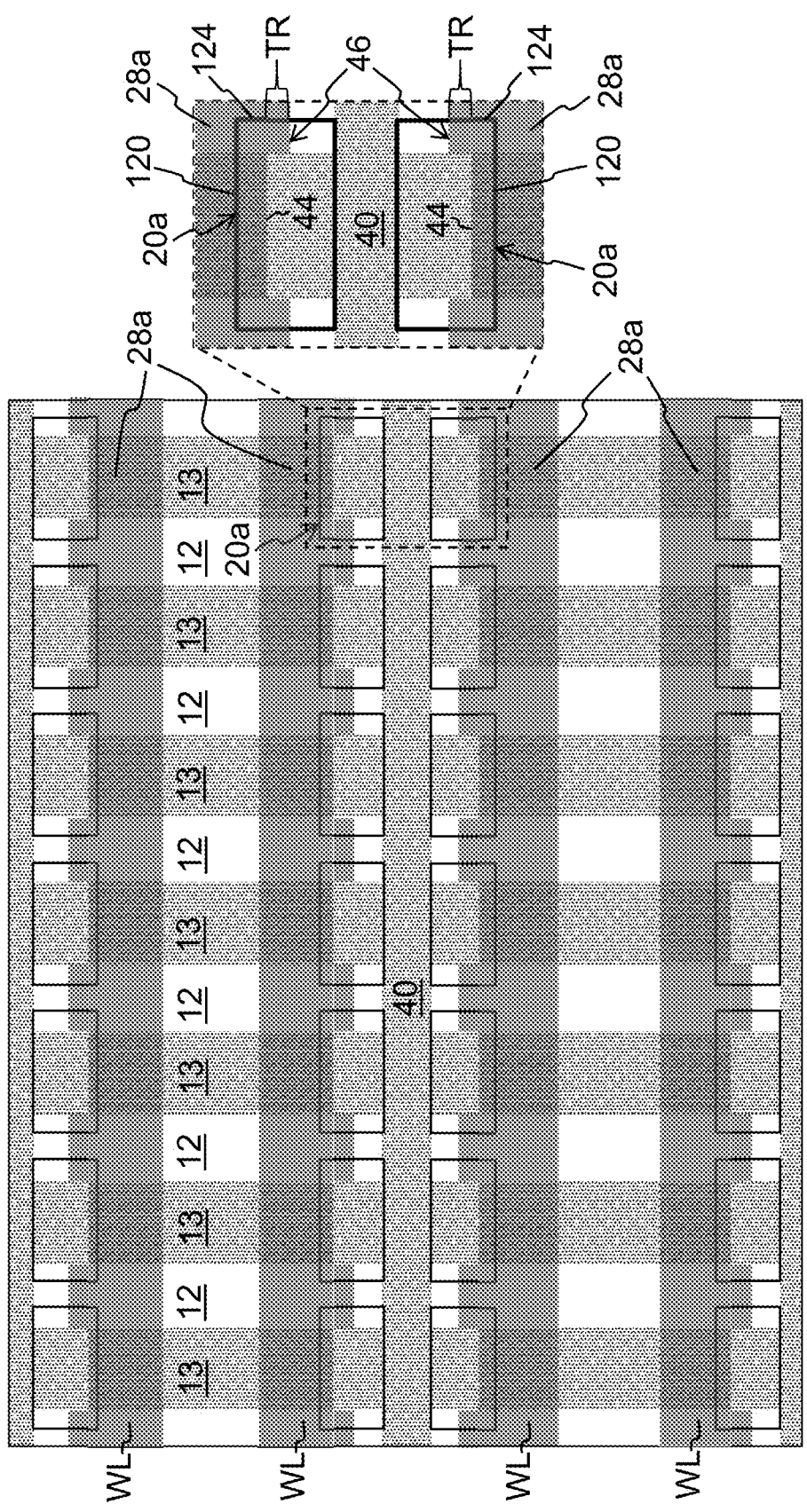
FIG. 5 is a top view illustrating an alternate embodiment of the present invention.

FIG. 5 illustrates an alternate embodiment, which is the same as the embodiment shown in FIG. 3C, except notches 44 are formed in the word lines WL at center portions of the floating gate 20a resulting in protruding tabs 46 of the control gates 28a extending out further over the side edges 124 than over the center of the floating gate 20a (i.e., each control gate 28a extends deeper over portions of side edges 124 than over a center portion of the floating gate 20a relative to front edge 120, such that the control gate 28a does not extend vertically over a portion of the floating gate 20a located between the tunnel region portion TR of the first side edge 124 and the tunnel region portion TR of the second side edge 124). Notch 44 reduces the amount of overlap between the control gate 28a and floating gate 20a (in the center area of the floating gate 20a that does not contribute to erasure), thus reducing capacitive coupling between control gate 28a and floating gate 20a which in turn can further enhance erase efficiency.

Figure 6:
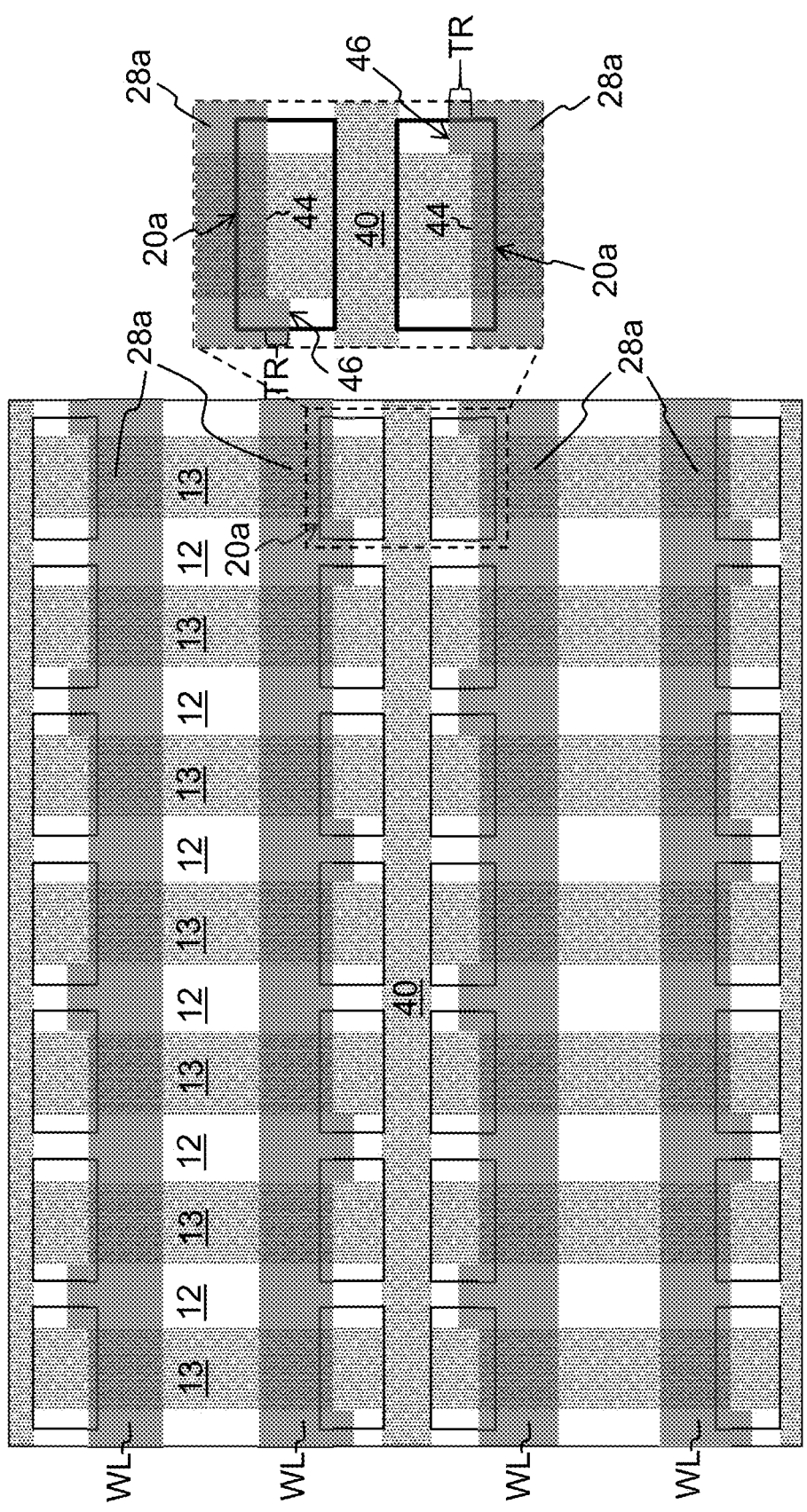
FIG. 6 is a top view illustrating an alternate embodiment of the present invention.

FIG. 6 illustrates another alternate embodiment, which is the same as the embodiment shown in FIG. 5, except that for each row of floating gates 20a, alternate tabs 46 are omitted, so that each control gate 28a extends over just one tunnel region portion TR of one side edge for each underlying floating gate 20a. The pattern of tabs 46 can alternate row by row, so tabs 46 in even numbered rows of floating gates 20a are disposed over different isolation regions 12 than tabs 46 in odd numbered rows of the floating gates 20a, as shown in FIG. 6.

Figure 7A:
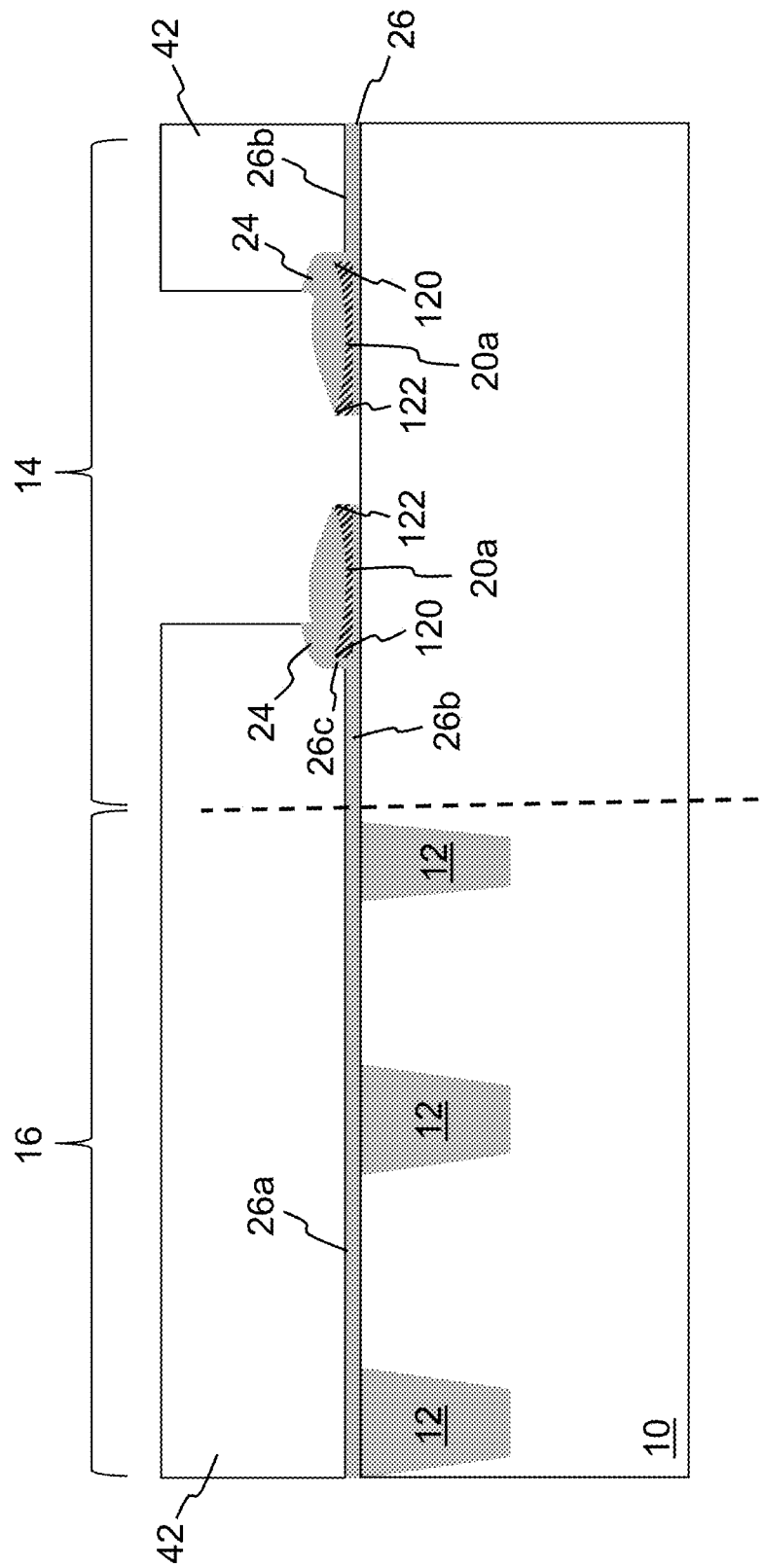
FIGS. 7A-7D are side cross-sectional views illustrating steps for forming memory cells and logic devices on a common substrate in accordance with an alternate embodiment of the present invention.

FIGS. 7A-7D illustrate yet another alternate embodiment, which starts with the structure shown in FIG. 2B. However, unlike the results of the oxide etch shown in FIG. 2C where the exposed portions of oxide layer 26c are maintained but reduced in thickness, the oxide etch is performed to entirely remove the exposed oxide (i.e., a wet or dry oxide etch is performed on the exposed portions of oxide layer 26c and oxide 24, which removes the oxide layer portions 26c on the side edges 124 and on back edges 122 and removes exposed portions of oxide 24), as shown in FIG. 7A. The photoresist 42 protects oxide layer portion 26a in the logic device region 16, as well as the oxide layer portions 26b on the substrate surface that are adjacent front edges 120 (on which the control gates will eventually be formed) and the other portions of oxide layer 26c protected by photoresist 42.

Figure 7B:
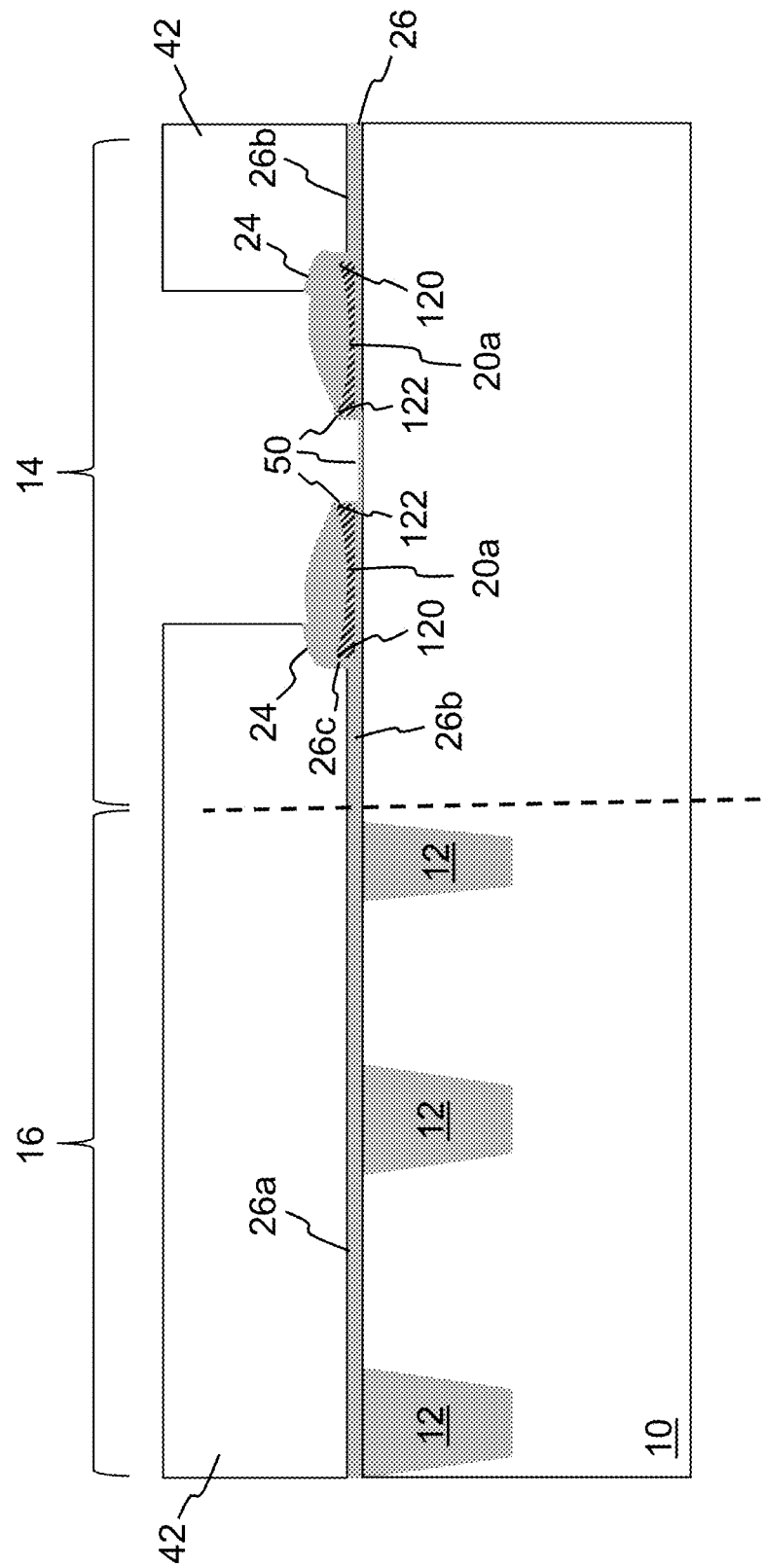
Figure 7C:
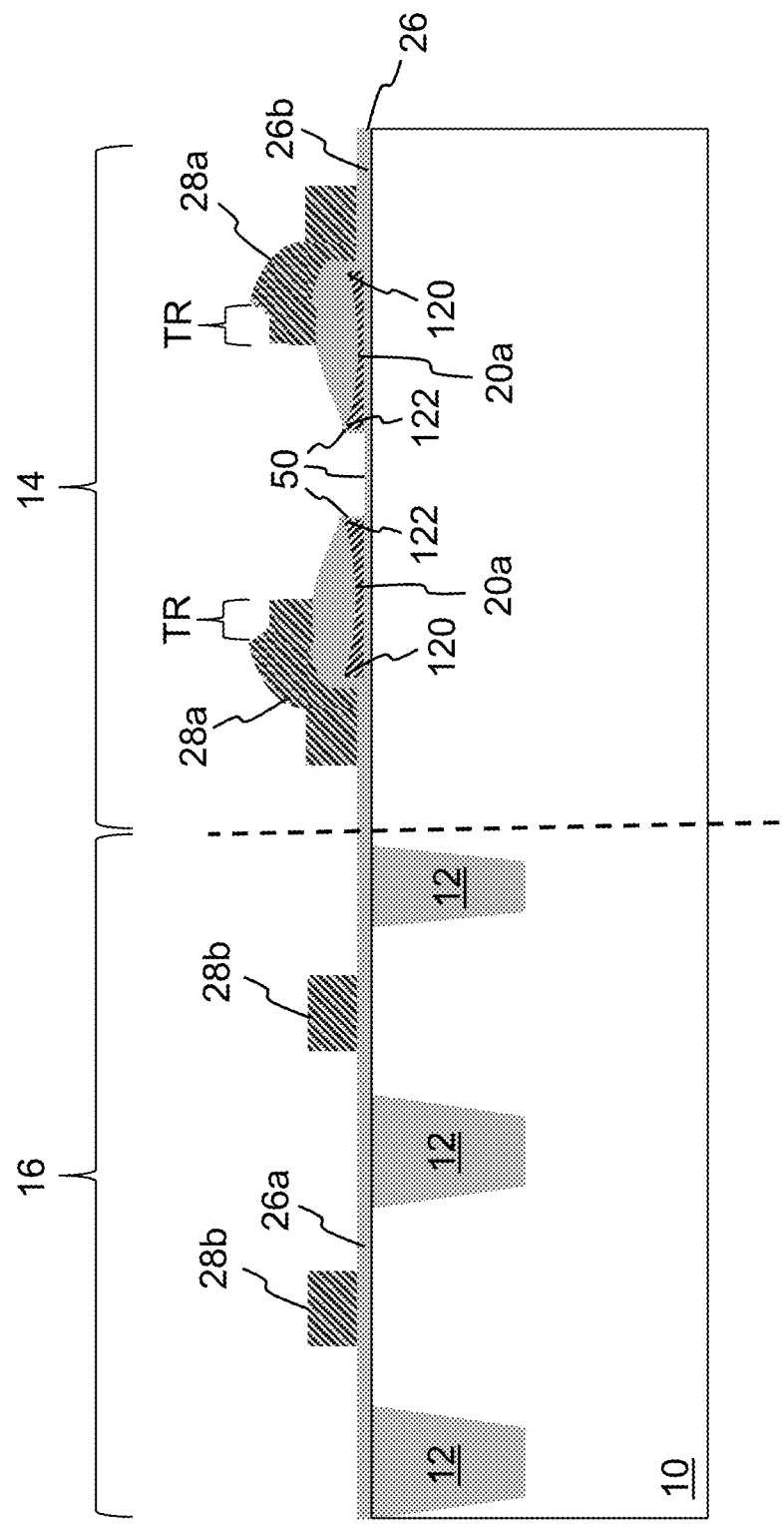
Figure 7D:
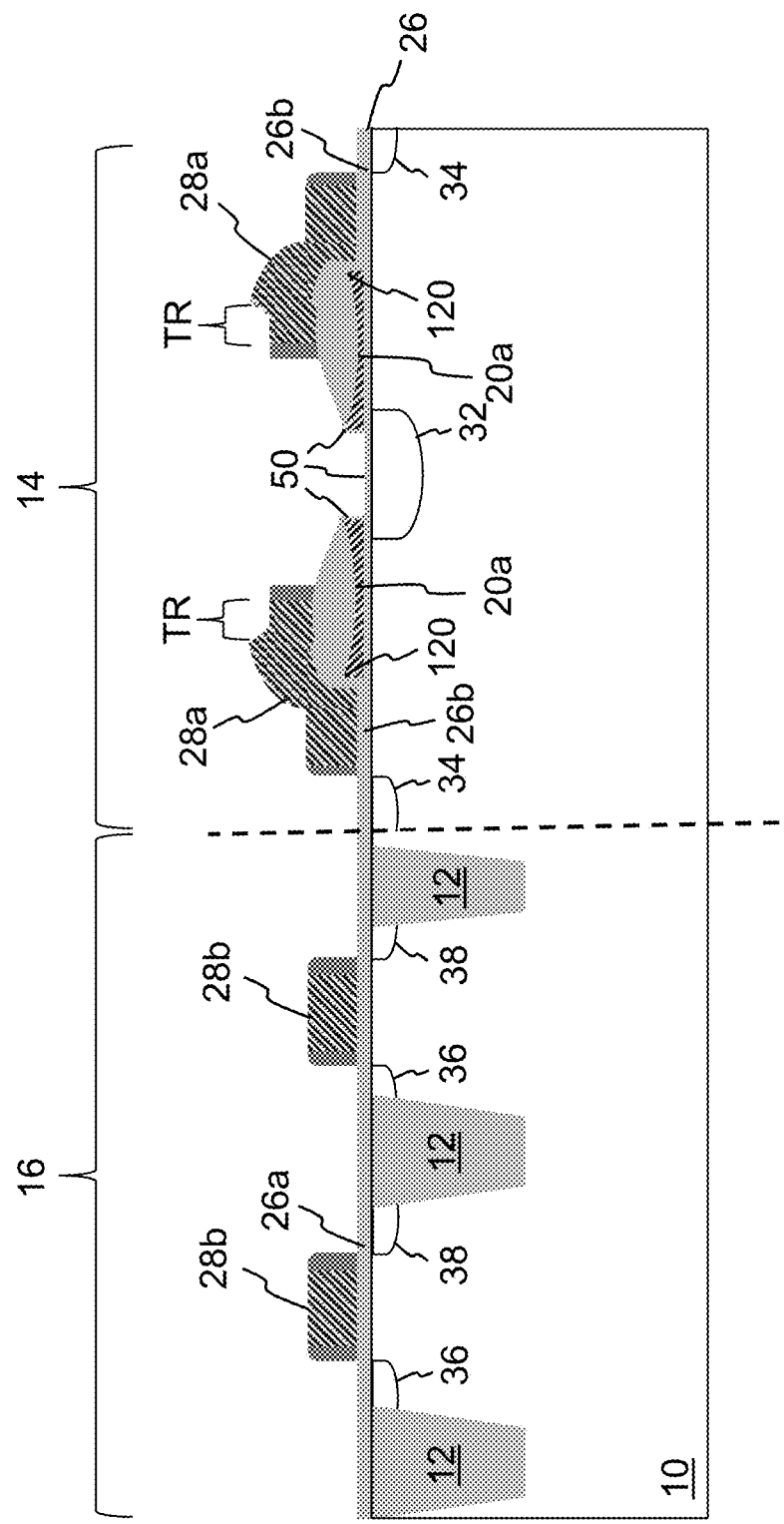

A layer of oxide 50 is then formed on the exposed portions of floating gates 20a and substrate 10 (e.g., by thermal oxidation), as shown in FIG. 7B. The thickness of layer 50 can be optimized for a tunnel oxide and is less than the thickness of the remaining oxide layer portions 26a, 26b and 26c. Formation of oxide 50 can be performed simultaneously in the logic device region 16 for forming logic devices suitable for low voltage operation. After photoresist 42 removed, the structure is processed as described above with respect to FIG. 2D to form the logic gates 28b and control gates 28a, as shown in FIG. 7C. This structure is then processed as described above with respect to FIG. 2E to form the various source and drain regions, as shown in FIG. 7D. This embodiment can be utilized to form any of the configurations in FIGS. 3C, 5 and 6. The advantage of this embodiment is that the thickness of oxide layer 50 may be better controlled relative to the thickness of thinned portions of oxide layer 26c.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed. Finally, the above described techniques for forming the memory cells could also be used in devices lacking a logic device region 16.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A memory device, comprising:
    a substrate of semiconductor material with a substrate upper surface having a memory cell region and a logic region;
    a floating gate disposed vertically over and insulated from the memory cell region of the substrate upper surface, wherein the floating gate includes an upper surface that terminates in opposing front and back edges and in opposing first and second side edges;
    an oxide layer having a first portion that extends along the logic region of the substrate upper surface and has a first thickness, a second portion that extends along the memory cell region of the substrate upper surface and has the first thickness, and a third portion that extends along the front and back edges and along the first and second side edges;
    wherein the third portion of the oxide layer extending along the front edge has the first thickness, and wherein the third portion of the oxide layer extending along a tunnel region portion of the first side edge has a second thickness less than the first thickness;
    a control gate having a first portion disposed on the second portion of the oxide layer, and having a second portion disposed vertically over the front edge and vertically over the tunnel region portion of the first side edge; and
    a logic gate on the first portion of the oxide layer;
    wherein the first portion of the oxide layer insulates the substrate from the logic gate, the second portion of the oxide layer insulates the substrate from the control gate first portion, and the third portion of the oxide layer along the tunnel region portion of the first side edge insulates the control gate second portion from the tunnel region portion of the first side edge.

2. The device of claim 1, wherein the upper surface of the floating gate is concave such that the front and back edges and the first and second side edges are sharp edges.

3. The device of claim 1, further comprising:
a first source region in the substrate adjacent an end of the floating gate;
a first drain region in the substrate adjacent an end of the control gate;
a second source region in the substrate adjacent a first end of the logic gate; and
a second drain region in the substrate adjacent a second end of the logic gate.

4. The device of claim 1, wherein:
the third portion of the oxide layer extending along a tunnel region portion of the second side edge has the second thickness;
the control gate second portion is further disposed vertically over the tunnel region portion of the second side edge; and
the third portion of the oxide layer along the tunnel region portion of the second side edge insulates the control gate second portion from the tunnel region portion of the second side edge.

5. The device of claim 4, wherein the control gate second portion extends vertically over a portion of the floating gate between the tunnel region portion of the first side edge and the tunnel region portion of the second side edge.

6. The device of claim 4, wherein the control gate second portion does not extend vertically over a portion of the floating gate between the tunnel region portion of the first side edge and the tunnel region portion of the second side edge.

7. A method of forming a memory device, comprising:
providing a substrate of semiconductor material with a substrate upper surface having a memory cell region and a logic region;
forming a floating gate disposed vertically over and insulated from the memory cell region of the substrate upper surface, wherein the floating gate includes an upper surface that terminates in opposing front and back edges and in opposing first and second side edges;
forming an oxide layer having a first portion that extends along the logic region of the substrate upper surface, a second portion that extends along the memory cell region of the substrate upper surface, and a third portion that extends along the front and back edges and along the first and second side edges;
performing an oxide etch that reduces a thickness of the third portion of the oxide layer along a tunnel region portion of the first side edge, wherein the first and second portions of the oxide layer and the third portion of the oxide layer along the front edge of the floating gate are protected from the oxide etch;
forming a control gate having a first portion disposed on the second portion of the oxide layer, and having a second portion disposed vertically over the front edge and vertically over the tunnel region portion of the first side edge; and
forming a logic gate on the first portion of the oxide layer;
wherein the first portion of the oxide layer insulates the substrate from the logic gate and has a first thickness, the second portion of the oxide layer insulates the substrate from the control gate first portion and has the first thickness, and the third portion of the oxide layer along the tunnel region portion of the first side edge insulates the control gate second portion from the tunnel region portion of the first side edge and has a second thickness less than the first thickness.

8. The method of claim 7, further comprising:
oxidizing the upper surface of the floating gate so that the upper surface of the floating gate is concave, and so that the front and back edges and the first and second side edges are sharp edges.

9. The method of claim 7, wherein the forming of the control gate and the forming of the logic gate comprise:
forming a polysilicon layer on the first, second and third portions of the oxide layer; and
selectively removing portions of the polysilicon layer leaving a first portion of the polysilicon layer as the formed control gate and leaving a second portion of the polysilicon layer as the formed logic gate.

10. The method of claim 7, further comprising:
forming a first source region in the substrate adjacent an end of the floating gate;
forming a first drain region in the substrate adjacent an end of the control gate;
forming a second source region in the substrate adjacent a first end of the logic gate; and
forming a second drain region in the substrate adjacent a second end of the logic gate;
wherein the forming of the first drain region, the second source region and the second drain region are performed simultaneously by an implantation process.

11. The method of claim 7, wherein:
the performing of the oxide etch further comprises reducing a thickness of the third portion of the oxide layer along a tunnel region portion of the second side edge;
the control gate second portion is disposed vertically over the tunnel region portion of the second side edge; and
the third portion of the oxide layer along the tunnel region portion of the second side edge insulates the control gate second portion from the tunnel region portion of the second side edge and has the second thickness.

12. The method of claim 11, wherein the control gate second portion extends vertically over a portion of the floating gate between the tunnel region portion of the first side edge and the tunnel region portion of the second side edge.

13. The method of claim 11, wherein the control gate second portion does not extend vertically over a portion of the floating gate between the tunnel region portion of the first side edge and the tunnel region portion of the second side edge.

14. A memory device, comprising:
a substrate of semiconductor material with a substrate upper surface having a memory cell region and a logic region;
a floating gate disposed vertically over and insulated from the memory cell region of the substrate upper surface, wherein the floating gate includes an upper surface that terminates in opposing front and back edges and in opposing first and second side edges;
a first oxide layer having a first portion that extends along the logic region of the substrate upper surface and has a first thickness, a second portion that extends along the memory cell region of the substrate upper surface and has the first thickness, and a third portion that extends along the front edge and has the first thickness;
a second oxide layer extending along a tunnel region portion of the first side edge and has a second thickness less than the first thickness;

a control gate having a first portion disposed on the second portion of the oxide layer, and having a second portion disposed vertically over the front edge and vertically over the tunnel region portion of the first side edge; and a logic gate on the first portion of the oxide layer;

wherein the first portion of the first oxide layer insulates the substrate from the logic gate, the second portion of the first oxide layer insulates the substrate from the control gate first portion, and the second oxide layer along the tunnel region portion of the first side edge insulates the control gate second portion from the tunnel region portion of the first side edge.

15. The device of claim 14, wherein the upper surface of the floating gate is concave such that the front and back edges and the first and second side edges are sharp edges.

16. The device of claim 14, further comprising:
a first source region in the substrate adjacent an end of the floating gate;
a first drain region in the substrate adjacent an end of the control gate;
a second source region in the substrate adjacent a first end of the logic gate; and
a second drain region in the substrate adjacent a second end of the logic gate.

17. The device of claim 14, wherein:
the second oxide layer further extends along a tunnel region portion of the second side edge and has the second thickness;
the control gate second portion is further disposed vertically over the tunnel region portion of the second side edge; and
the second oxide layer along the tunnel region portion of the second side edge insulates the control gate second portion from the tunnel region portion of the second side edge.

18. The device of claim 17, wherein the control gate second portion extends vertically over a portion of the floating gate between the tunnel region portion of the first side edge and the tunnel region portion of the second side edge.

19. The device of claim 17, wherein the control gate second portion does not extend vertically over a portion of the floating gate between the tunnel region portion of the first side edge and the tunnel region portion of the second side edge.

20. A method of forming a memory device, comprising:
providing a substrate of semiconductor material with a substrate upper surface having a memory cell region and a logic region;
forming a floating gate disposed vertically over and insulated from the memory cell region of the substrate upper surface, wherein the floating gate includes an upper surface that terminates in opposing front and back edges and in opposing first and second side edges;
forming a first oxide layer having a first portion that extends along the logic region of the substrate upper surface, a second portion that extends along the memory cell region of the substrate upper surface, and a third portion that extends along the front and back edges and along the first and second side edges;
performing an oxide etch that removes the third portion of the first oxide layer along a tunnel region portion of the first side edge, wherein the first and second portions of the first oxide layer and the third portion of the first oxide layer along the front edge of the floating gate are protected from the oxide etch;

forming a second oxide layer along the tunnel region portion of the first side edge;

forming a control gate having a first portion disposed on the second portion of the first oxide layer, and having a second portion disposed vertically over the front edge and vertically over the tunnel region portion of the first side edge; and forming a logic gate on the first portion of the first oxide layer;

wherein the first portion of the first oxide layer insulates the substrate from the logic gate and has a first thickness, the second portion of the first oxide layer insulates the substrate from the control gate first portion and has the first thickness, and the second oxide layer along the tunnel region portion of the first side edge insulates the control gate second portion from the tunnel region portion of the first side edge and has a second thickness less than the first thickness.

21. The method of claim 20, further comprising:
oxidizing the upper surface of the floating gate so that the upper surface of the floating gate is concave, and so that the front and back edges and the first and second side edges are sharp edges.

22. The method of claim 20, wherein the forming of the control gate and the forming of the logic gate comprise:
forming a polysilicon layer on the first, second and third portions of the first oxide layer and on the second oxide layer; and
selectively removing portions of the polysilicon layer leaving a first portion of the polysilicon layer as the formed control gate and leaving a second portion of the polysilicon layer as the formed logic gate.

23. The method of claim 20, further comprising:
forming a first source region in the substrate adjacent an end of the floating gate;
forming a first drain region in the substrate adjacent an end of the control gate;
forming a second source region in the substrate adjacent a first end of the logic gate; and
forming a second drain region in the substrate adjacent a second end of the logic gate;
wherein the forming of the first drain region, the second source region and the second drain region are performed simultaneously by an implantation process.

24. The method of claim 20, wherein:
the forming of the second oxide layer further comprises forming the second oxide layer along a tunnel region portion of the second side edge;
the control gate second portion is disposed vertically over the tunnel region portion of the second side edge; and
the second oxide layer along the tunnel region portion of the second side edge insulates the control gate second portion from the tunnel region portion of the second side edge and has the second thickness.

25. The method of claim 24, wherein the control gate second portion extends vertically over a portion of the floating gate between the tunnel region portion of the first side edge and the tunnel region portion of the second side edge.

26. The method of claim 24, wherein the control gate second portion does not extend vertically over a portion of the floating gate between the tunnel region portion of the first side edge and the tunnel region portion of the second side edge.

* * * * *